(12) United States Patent
Lee et al.

(10) Patent No.: US 7,927,899 B2
(45) Date of Patent: Apr. 19, 2011

(54) LIQUID CRYSTAL DISPLAY PANEL AND FABRICATING METHOD THEREOF

(75) Inventors: Kyoung Mook Lee, Seoul (KR); Jae Young Oh, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/320,895

(22) Filed: Feb. 6, 2009

(65) Prior Publication Data

US 2009/0152556 A1 Jun. 18, 2009

Related U.S. Application Data

(62) Division of application No. 11/118,496, filed on May 2, 2005, now Pat. No. 7,501,296.

(30) Foreign Application Priority Data

May 1, 2004 (KR) .................. 10-2004-0030853

(51) Int. Cl.
*H01L 21/00* (2006.01)

(52) U.S. Cl. .......................... 438/30; 438/149

(58) Field of Classification Search ............... 438/30, 438/149
See application file for complete search history.

(56) References Cited

U.S. PATENT DOCUMENTS

2003/0087179 A1   5/2003   Iwasaki

FOREIGN PATENT DOCUMENTS

| JP | 2001-154221 | 6/2001 |
| KR | 1020000010168 | 2/2000 |
| KR | 1020030082647 | 10/2003 |
| KR | 100537020 | 12/2005 |

*Primary Examiner* — Thien F Tran
(74) *Attorney, Agent, or Firm* — McKenna Long & Aldridge LLP

(57) ABSTRACT

A liquid crystal display panel includes: a thin film transistor array substrate having a gate line and a data line provided on the substrate; a gate insulating film between the gate line and the data line; a thin film transistor having a source electrode, a drain electrode and a gate electrode; a pixel electrode; a protective film for protecting the thin film transistor; a plurality of pads; a transparent electrode pattern formed on the data line, source electrode and drain electrode; and a color filter array substrate joined to the thin film transistor array substrate so that the color filter substrate does not overlap the pad area of the thin film transistor array substrate, wherein at least one of the gate insulating film and protective film in the pad area is etched using the color filter array substrate as a mask to expose at least one of the plurality of pads.

3 Claims, 39 Drawing Sheets

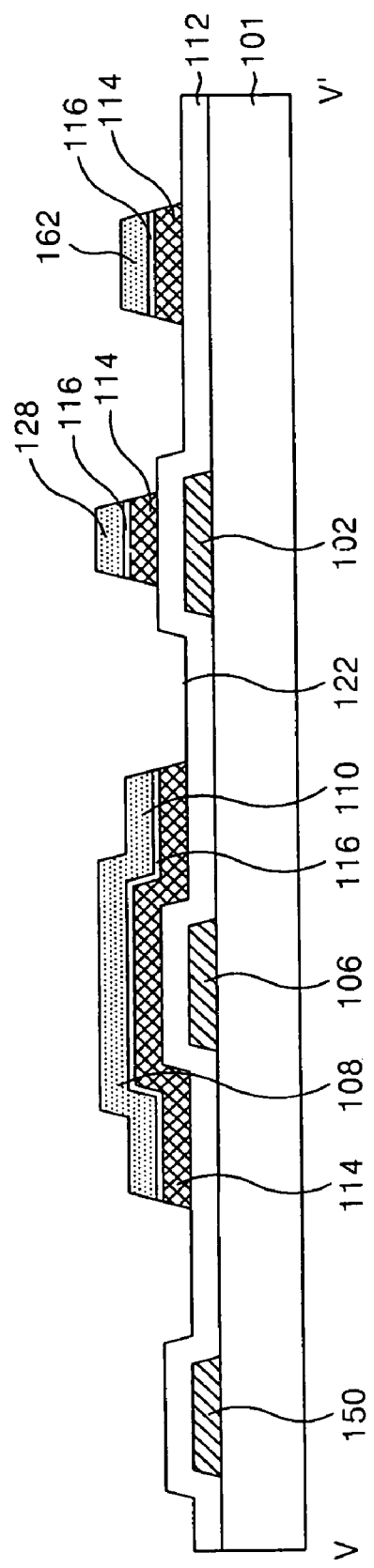

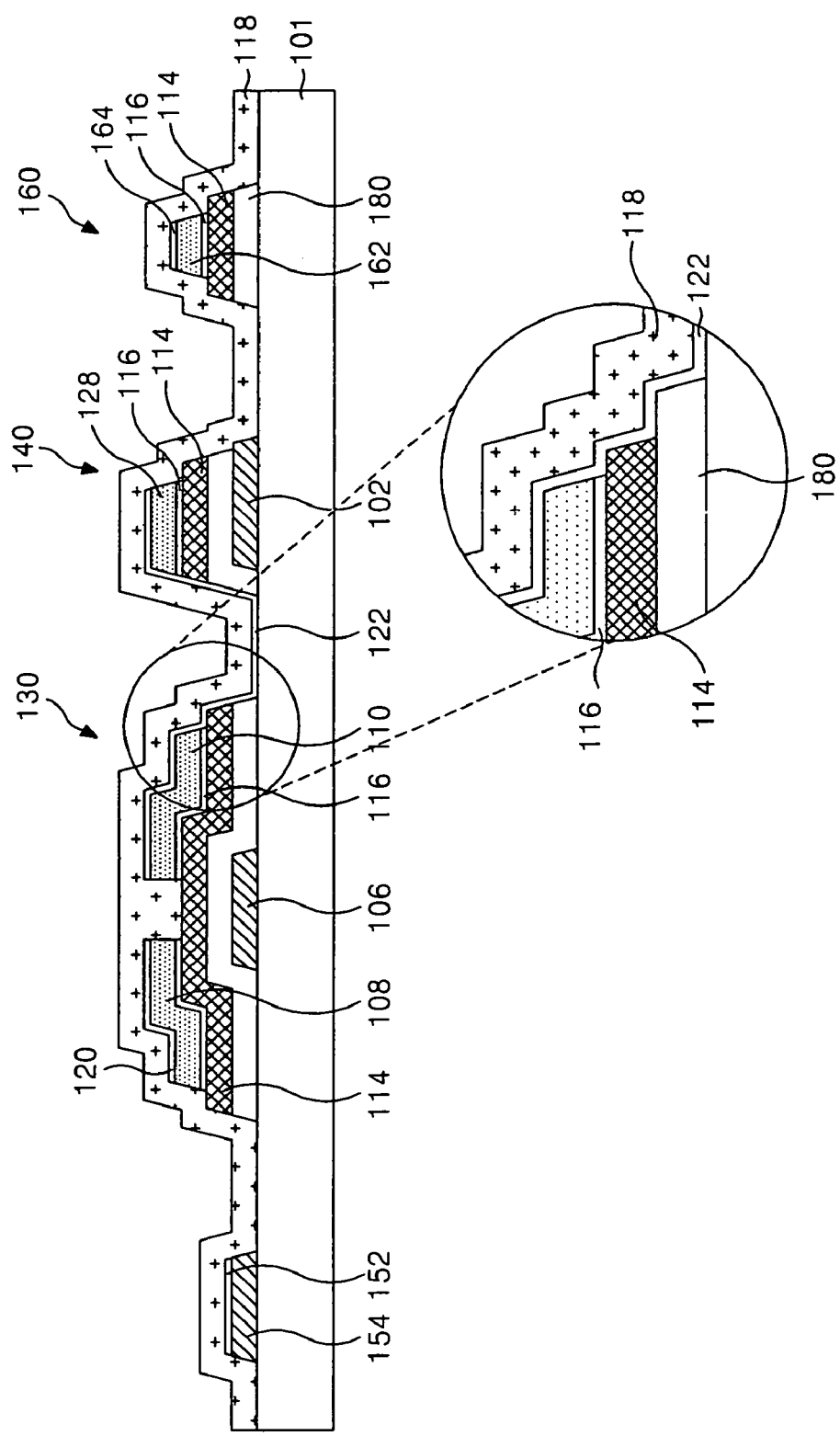

LIQUID CRYSTAL DISPLAY PANEL AND FABRICATING METHOD THEREOF

CROSS-REFERENCE TO RELATED APPLICATIONS

This application is a Divisional of application Ser. No. 11/118,496 filed May 2, 2005 now U.S. Pat. No. 7,501,296, now allowed; which claims priority to Korean Patent Application No. 10-2004-0030853, filed May 1, 2004, all of which are hereby incorporated by reference for all purposes as if fully set forth herein.

BACKGROUND OF THE INVENTION

1. Field of the Invention

This invention relates to a liquid crystal display, and more particularly to a liquid crystal display panel and a fabricating method thereof.

2. Description of the Related Art

Generally, a liquid crystal display (LCD) controls light transmittance of a liquid crystal using an electric field to display a picture. The LCD drives the liquid crystal with an electric field that is formed between a pixel electrode and a common electrode arranged in opposition to each other on upper and lower substrates, respectively. The LCD includes a thin film transistor array substrate and a color filter array substrate that are joined in opposition to each other. A spacer for keeping constant a cell gap is positioned between the two array substrates. A liquid crystal fills the cell gap between the two array substrates.

The thin film transistor array substrate includes a plurality of signal wirings and thin film transistors. An alignment film is coated over the plurality of signal wirings and thin film transistors for aligning the liquid crystal. The color filter array substrate includes a color filter for implementing a color, a black matrix for preventing leakage of light, and an alignment film aligning the liquid crystal.

The thin film transistor array substrate has a complicated fabrication process. The large number of semiconductor processes as well as the need for many mask processes are major factors in the manufacturing cost of the liquid crystal display panel. To address these cost issues, fabrication techniques for a thin film transistor array substrate have been developed that reduce the number of mask processes. One mask process includes a lot of sub-processes, such as thin film deposition, cleaning, photolithography, etching, photo-resist stripping and inspection processes. Recently, a four-round mask process, which excludes one mask process from the pre-existent five-round mask process that was a standard mask process of the thin film transistor, has been developed.

FIG. 1 is a plan view illustrating a lower transistor array substrate adopting a related art four-round mask process, and FIG. 2 is a cross-sectional view of the thin film transistor array substrate taken along line II-II' in FIG. 1. As shown in FIG. 1 and FIG. 2, a thin film transistor array substrate of a related art liquid crystal display panel includes a gate line 2 and a data line 4 provided on a lower substrate 1 in such a manner as to cross each other and to define a cell area, a gate insulating film 12 between the gate line 2 and the data line 4, a thin film transistor 30 provided adjacent to each crossing, a pixel electrode 22 provided in the cell area, a storage capacitor 40 defined where the gate line 2 and a storage electrode 28 overlap, a gate pad 50 connected to the gate line 2, and a data pad 60 connected to the data line 4.

The thin film transistor 30 allows a pixel signal on the data line 4 to be applied to the pixel electrode 22 in response to a gate signal on the gate line 2. The thin film transistor 30 includes a gate electrode 6 connected to the gate line 2, a source electrode 8 connected to the data line 4, and a drain electrode 10 connected to the pixel electrode 22. Further, the thin film transistor 30 includes an active layer 14 overlapping the gate electrode 6 with a gate insulating film 12 between the active layer 14 and the gate electrode 6. A channel is defined between the source electrode 8 and the drain electrode 10 in the active layer 14.

The active layer 14 also overlaps the data line 4, a lower data pad electrode 62 and a storage electrode 28. An ohmic contact layer on the active layer 14 makes contact with the data line 4 and the source electrode 8. Another ohmic contact layer on the active layer 14 makes contact with the drain electrode 10. Other ohmic contact layers contact the lower data pad electrode 62 and the storage electrode 28, respectively.

The pixel electrode 22 is connected, via a first contact hole 20 passing through a protective film 18, to the drain electrode 10 of the thin film transistor 30, and is provided in a pixel area 5. An electric field can be formed between the pixel electrode 22 to which a pixel signal is supplied via the thin film transistor 30 and a common electrode (not shown) supplied with a reference voltage. Liquid crystal molecules between the thin film transistor array substrate and the color filter array substrate are rotated by the electric field due to a dielectric anisotropy. Transmittance of a light propagating through the pixel area 5 can be differentiated by the extent of the rotation of the liquid crystal molecules so as to implement a gray level scale.

The storage capacitor 40 includes the gate line 2 overlapped by the active layer 14, the ohmic contact layer 16, and a storage electrode 28. A gate insulating film 12 is positioned between the active layer 14 and the gate line 2. The storage electrode 28 is connected, via a second contact hole 42 through the protective film 18, to the pixel electrode 22. The storage capacitor 40 allows a pixel signal applied on the pixel electrode 22 to be stably maintained until the next pixel signal is applied.

The gate pad 50 is connected to a gate driver (not shown) for applying a gate signal to the gate line 2. The gate pad 50 includes a lower gate pad electrode 52 extending from the gate line 2 and an upper gate pad electrode 54 connected, via a third contact hole 56 through the gate insulating film 12 and the protective film 18, to the lower gate pad electrode 52. The data pad 60 is connected to a data driver (not shown) for applying a data signal to the data line 4. The data pad 60 includes a lower data pad electrode 62 extending from the data line 4, and an upper data pad electrode 64 connected, via a fourth contact hole 66 through the protective film 18, to an upper data pad electrode 64 connected to the lower data pad electrode 62.

A method of fabricating the thin film transistor array substrate of the liquid crystal display panel having the above-mentioned structure using the four-round mask process will be described in detail with reference to FIG. 3A to FIG. 3D, hereinafter.

Referring to FIG. 3A, a first conductive pattern group, including the gate line 2, the gate electrode 6 and the lower gate pad electrode 52, is provided on the lower substrate 1 by a first mask process. More specifically, a gate metal layer is formed on the lower substrate 1 by a deposition technique, such as sputtering. Then, the gate metal layer is patterned by a photolithography and an etching process using the first mask to form the first conductive pattern group, including the gate line 2, the gate electrode 6 and the lower gate pad electrode 52. The gate metal layer is made from an aluminum group metal, for example.

Referring to FIG. 3B, the gate insulating film 12 is coated onto the lower substrate 1 having the first conductive pattern group. Further, semiconductor patterns including the active layer 14 and the ohmic contact layer 16, and a second conductive pattern group, including the data line 4, the source electrode 8, the drain electrode 10, the lower data pad electrode 62 and the storage electrode 28, are formed on the gate insulating film 12 by a second mask process. More specifically, the gate insulating film 12, an amorphous silicon layer, a n$^+$ amorphous silicon layer and a data metal layer are sequentially provided on the lower substrate 1 having the first conductive pattern group by deposition techniques, such as plasma enhanced chemical vapor deposition (PECVD) or sputtering. The gate insulating film 12 is formed from an inorganic insulating material, such as silicon nitride ($SiN_x$) or silicon oxide ($SiO_x$). The data metal layer is selected from molybdenum (Mo), titanium (Ti), tantalum (Ta) or a molybdenum alloy, for example. Then, a photo-resist pattern is formed on the data metal layer by the photolithography using the second mask.

In this case, a diffractive exposure mask having a diffractive exposing part at a channel portion of the thin film transistor is used as a second mask. Thus, the channel portion of the photo-resist pattern has a lower height than other source/drain pattern portions. Subsequently, the data metal layer is patterned by a wet etching process using the photo-resist pattern to provide the second conductive pattern group, including the data line 4 with the source electrode 8 and drain electrode 10 integral to the data line 4 and the storage electrode 28.

Next, the n$^+$ amorphous silicon layer and the amorphous silicon layer are patterned at the same time by a dry etching process using the same photo-resist pattern to thereby provide the ohmic contact layer 14 and the active layer 16. The photo-resist pattern having a relatively low height is removed from the channel portion by an ashing process and thereafter the data metal layer and the ohmic contact layer 16 of the channel portion are etched by the dry etching process. Then, the active layer 14 of the channel portion is exposed to disconnect the source electrode 8 from the drain electrode 10. The photo-resist pattern left on the second conductive pattern group is removed by a stripping process.

Referring to FIG. 3C, the protective film 18 including the first to fourth contact holes 20, 42, 56 and 66 is formed in the gate insulating film 12 having a second conductive pattern group. More specifically, the protective film 18 is formed entirely over the gate insulating film 12 having the data patterns deposited by a deposition technique, such as a plasma enhanced chemical vapor deposition (PECVD). Then, the protective film 18 is patterned by a photolithography and an etching process using a third mask to thereby define the first to fourth contact holes 20, 42, 56 and 66. The first contact hole 20 passes through the protective film 18 to expose the drain electrode 10. The second contact hole 42 passes through the protective film 18 to expose the storage electrode 28. The third contact hole 56 passes through both the protective film 18 and the gate insulating film 12 to expose the lower gate pad electrode 52. The fourth contact hole 66 passes through the protective film 18 to expose the lower data pad electrode 62.

When metal having a large dry etching ratio, such as molybdenum (Mo), is used as the data metal, the first, second and fourth contact holes 20, 42 and 66 pass through the drain electrode 10, the storage electrode 28 and the lower data pad electrode 62, respectively, and expose side surfaces of the drain electrode 10, the storage electrode 28 and the lower data pad electrode 62, respectively. The protective film 18 is made from an inorganic insulating material identical to the gate insulating film 12, or an organic insulating material, such as an acrylic organic compound having a small dielectric constant, BCB (benzocyclobutene) or PFCB (perfluorocyclobutane).

Referring to FIG. 3D, a third conductive pattern group patterns, including the pixel electrode 22, the upper gate pad electrode 54 and the upper data pad electrode 64, are provided on the protective film 18 by a fourth mask process. More specifically, a transparent conductive film is coated onto the protective film 18 by a deposition technique, such as sputtering. Then, the transparent conductive film is patterned by a photolithography and an etching process using a fourth mask to provide the third conductive pattern group, including the pixel electrode 22, the upper gate pad electrode 54 and the upper data pad electrode 64. The pixel electrode 22 is electrically connected, via the first contact hole 20, to the drain electrode 10 while also being electrically connected, via the second contact hole 42, to the storage electrode 28. The upper gate pad electrode 54 is electrically connected, via the third contact hole 56, to the lower gate pad electrode 52. The upper data pad electrode 64 is electrically connected, via the fourth contact hole 66, to the lower data pad electrode 62. The transparent conductive film is one of indium-tin-oxide (ITO), tin-oxide (TO), indium-tin-zinc-oxide (ITZO) and indium-zinc-oxide (IZO).

As described above, the related art thin film transistor array substrate and the fabricating method thereof uses the four-round mask process, thereby reducing the number of fabricating processes and hence reducing manufacturing cost proportional to the number of fabricating processes in comparison to using the five-round mask process. However, the four-round mask process still has a complicated fabricating process. More particularly, the diffractive exposure mask used in the four-round mask process is more complicated and more expensive than a photo mask that just has a shielding part and a transmitting part. Thus, there is still a need to simplify the fabricating process and to reduce manufacturing costs.

SUMMARY OF THE INVENTION

Accordingly, the present invention is directed to a liquid crystal display panel and a fabricating method thereof that substantially obviates one or more of the problems due to limitations and disadvantages of the related art.

An object of the present invention to provide a liquid crystal display panel and a fabricating method thereof with a reduced number of mask processes.

Another object of the present invention to provide a liquid crystal display panel and a fabricating method thereof without using a partial exposure mask.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

In order to achieve these and other objects of the invention, a liquid crystal display panel according to one aspect of the present invention includes: a thin film transistor array substrate having a gate line and a data line provided on the substrate in such a manner as to cross each other; a gate insulating film between the gate line and the data line on the thin film transistor array substrate; a thin film transistor provided adjacent to the crossing of the gate line and the data line on the thin film transistor array substrate, the thin film transistor having a source, drain and gate electrodes; a pixel electrode connected to the thin film transistor on the thin film transistor array substrate; a protective film for protecting the thin film transistor on the thin film transistor array substrate; a plurality of pads respectively connected to one of the gate line and the data line in a pad area of the thin film transistor array substrate; a transparent electrode pattern formed on the data line, source electrode and drain electrode of the thin film transistor array substrate; and a color filter array substrate joined to the thin film transistor array substrate so that the color filter substrate does not overlap the pad area of the thin film transistor array substrate, wherein at least one of the gate insulating film and protective film in the pad area is etched using the color filter array substrate as a mask to expose at least one of the plurality of pads.

In another aspect of the present invention, a method of fabricating a liquid crystal display panel includes the steps of: forming a gate line and a data line on a thin film transistor array substrate in such a manner as to cross each other; forming a gate insulating film between the gate line and the data line on the thin film transistor array substrate; forming a thin film transistor adjacent to the crossing of the gate line and the data line on the thin film transistor array substrate, the thin film transistor having a source, drain and gate electrodes; forming a pixel electrode connected to the thin film transistor on the thin film transistor array substrate; forming a protective film for protecting the thin film transistor on the thin film transistor array substrate; forming a pad connected to one of the gate line and the data line in a pad area of the thin film transistor array substrate; forming a transparent electrode pattern on the data line, source electrode and drain electrode of the thin film transistor array substrate; joining a color filter array substrate to the thin film transistor array substrate so that the color filter substrate does not overlap the pad area of the thin film transistor array substrate; and etching at least one of the gate insulating film and protective film in the pad area using the color filter array substrate as a mask.

It is to be understood that both the foregoing general description and the following detailed description are exemplary and explanatory and are intended to provide further explanation of the invention as claimed.

BRIEF DESCRIPTION OF THE DRAWINGS

These and other objects of the invention will be apparent from the following detailed description of the embodiments of the present invention with reference to the accompanying drawings.

FIG. 7A and FIG. 7B are a plan view and a cross-sectional view, respectively, for explaining a second mask process in a method of fabricating the thin film transistor array substrate according to the first exemplary embodiment of the present invention.

FIG. 17 is a cross-sectional view showing a structure of a thin film transistor array substrate of a liquid crystal display panel according to a third exemplary embodiment of the present invention.

DETAILED DESCRIPTION OF THE PREFERRED EMBODIMENTS

Reference will now be made in detail to the preferred embodiments of the present invention, examples of which are illustrated in the accompanying drawings. Hereinafter, the preferred embodiments of the present invention will be described in detail with reference to FIGS. 4 to 19.

Figure 1:
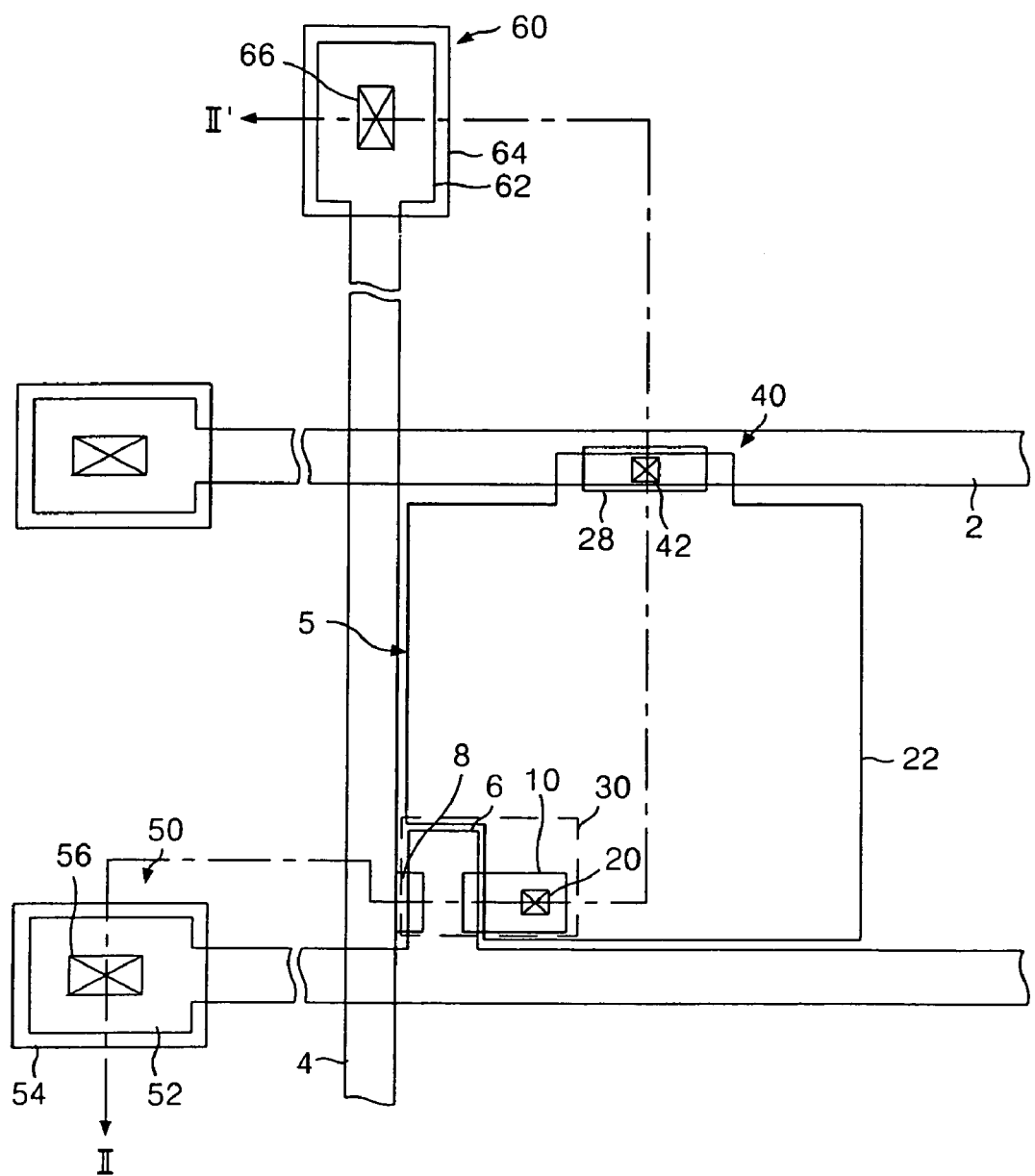
FIG. 1 is a plan view showing a thin film transistor array substrate of a related art liquid crystal display panel.
Figure 2:
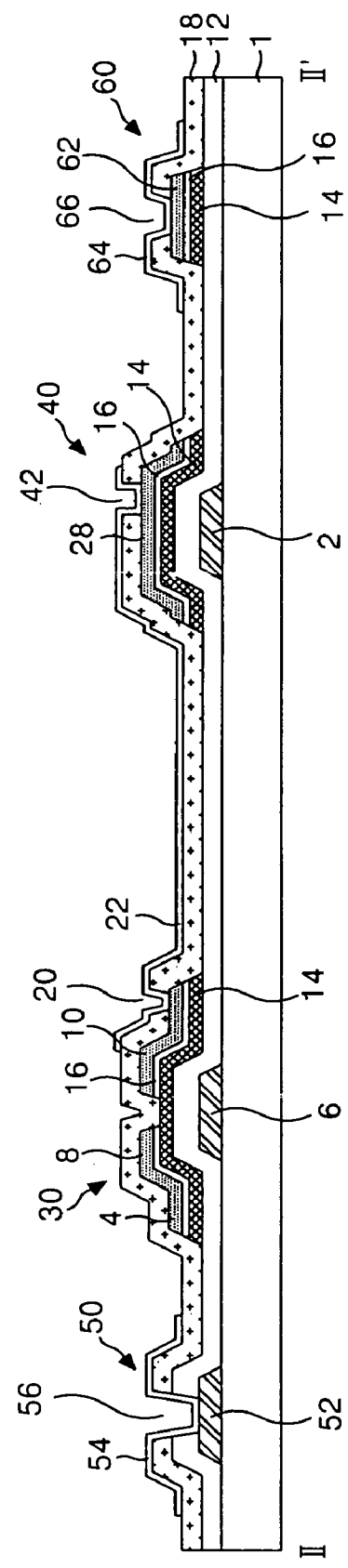
FIG. 2 is a cross-sectional view of the thin film transistor array substrate taken along line II-II' in FIG. 1.
Figure 3A:
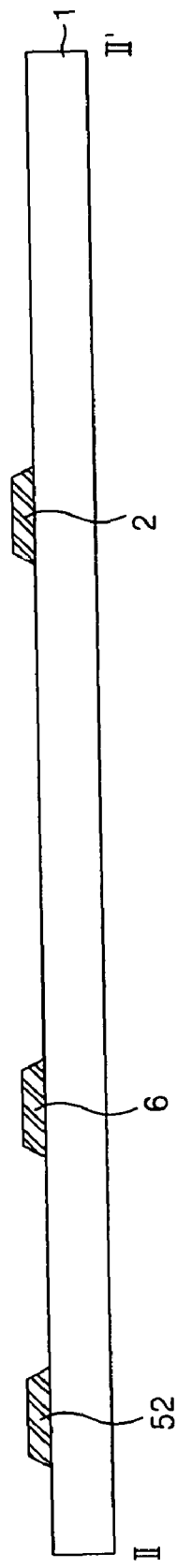
FIG. 3A to FIG. 3D are cross-sectional views illustrating a method of fabricating the thin film transistor array substrate shown in FIG. 2 step by step.
Figure 3B:
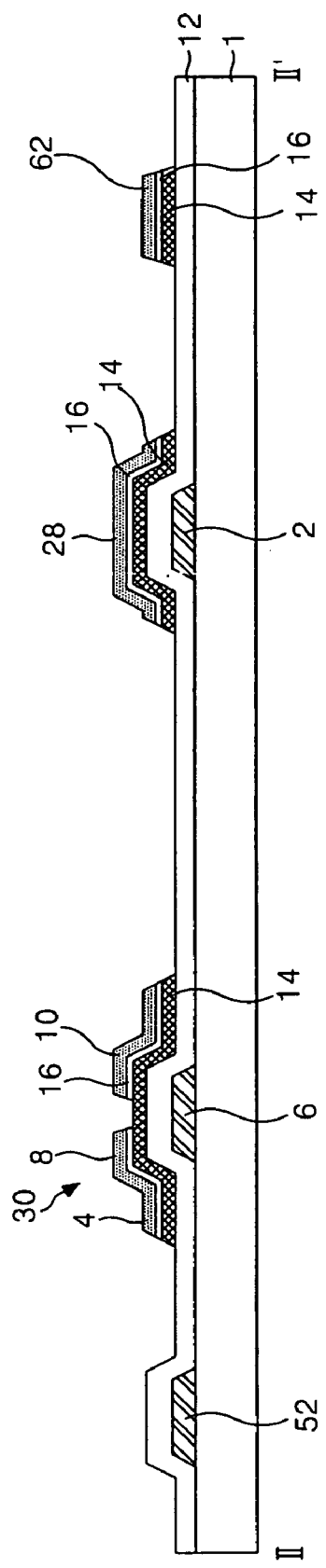
Figure 3C:
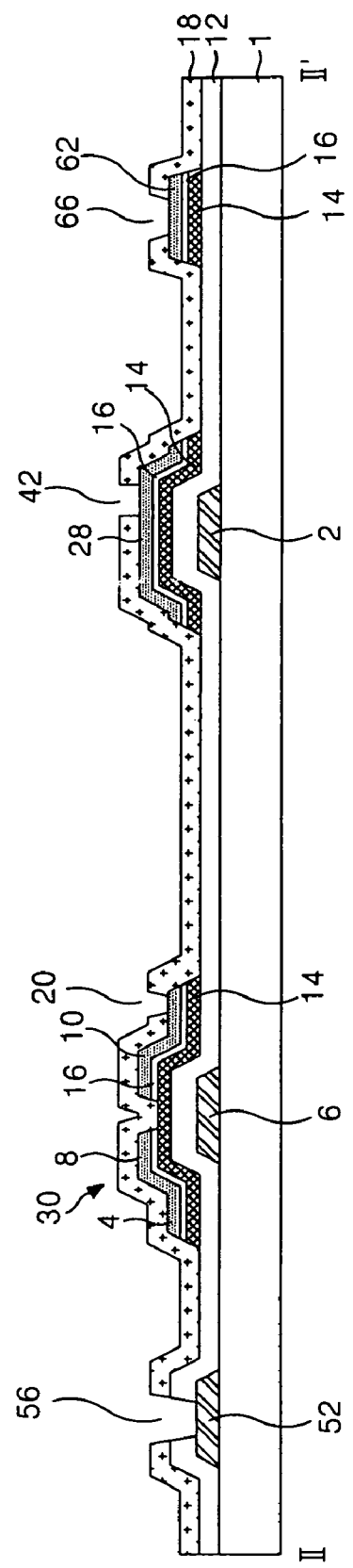
Figure 3D:
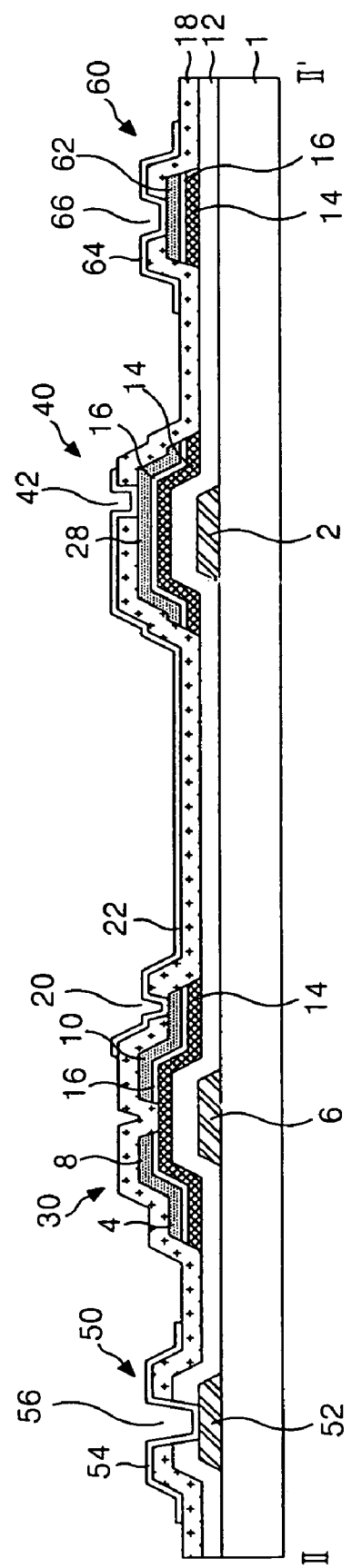
Figure 4:
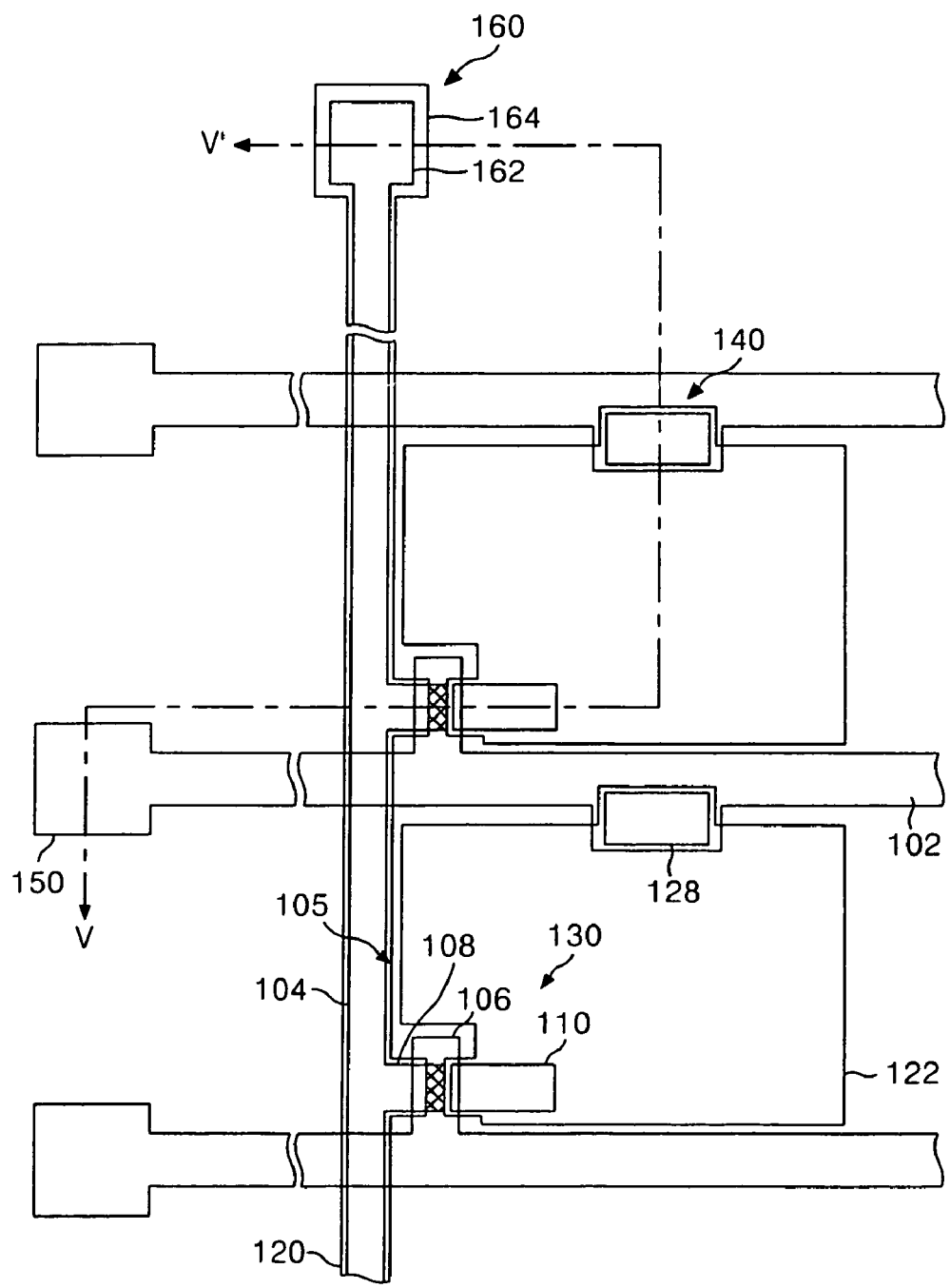
FIG. 4 is a plan view showing a structure of a thin film transistor array substrate of a liquid crystal display panel according to a first exemplary embodiment of the present invention.
Figure 5:
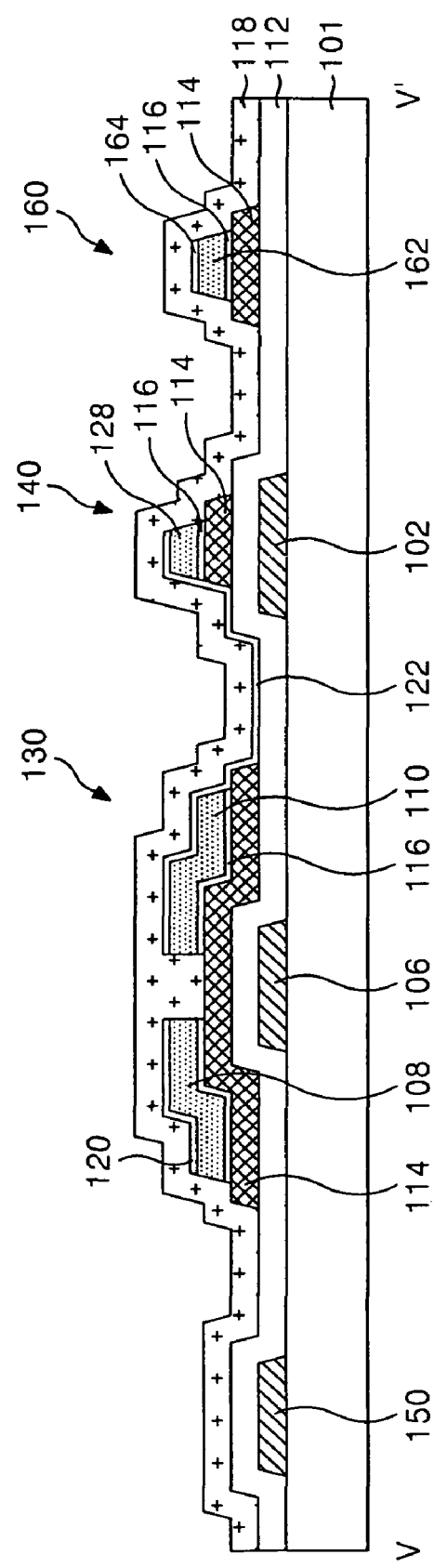
FIG. 5 is a cross-sectional view of the thin film transistor array substrate taken along line V-V' in FIG. 4.

FIG. 4 is a plan view showing a structure of a thin film transistor array substrate of a liquid crystal display panel according to a first exemplary embodiment of the present invention, and FIG. 5 is a cross-sectional view of the thin film transistor array substrate taken along line V-V' in FIG. 4. As shown in FIG. 4 and FIG. 5, a thin film transistor array substrate includes a gate line 102 and a data line 104 provided on a lower substrate 101 in such a manner as to cross each other. A gate insulating film 112 is positioned between the gate line 102 and the data line 104. A thin film transistor 130 is provided adjacent to each crossing of the gate line and the data line. A pixel electrode 122 is provided in a pixel area 105 defined by the crossing gate line 102 and data line 104. A storage capacitor 140 is provided by the pixel electrode 122 overlapping the gate line 102. The gate line 102 applies a gate signal to the gate electrode 106 of the thin film transistor 130. A gate pad 150 extends from the gate line 102. The data line 104 applies a data signal, via the thin film transistor 130, to the pixel electrode 122. A data pad 160 extends from the data line 104.

A transparent conductive pattern 120 is formed along the data line 104 and on the data line 104. The transparent conductive pattern 120 is formed from the same material as the pixel electrode 122 to provide a redundancy function if the data line 104 breaks. Further, the transparent conductive pattern 120 is provided on the data line 104 as well as on the source electrode 108 and the drain electrode 110.

The thin film transistor 130 allows a pixel signal on the data line 104 to be applied onto the pixel electrode 122 in response to a gate signal on the gate line 102.

To this end, the thin film transistor 130 includes a gate electrode 106 connected to the gate line 102, a source electrode 108 connected to the data line 104, and a drain electrode 110 connected to the pixel electrode 122. Further, the thin film transistor 130 includes semiconductor patterns 114 and 116 overlapping with the gate electrode 106. The semiconductor patterns 114 and 116 are insulated from the gate electrode 106 by a gate insulating film 112. The semiconductor pattern forms a channel between the source electrode 108 and the drain electrode 110. Further, the semiconductor pattern includes ohmic contact layers 116 for making ohmic contacts with the storage electrode 128, the lower data pad electrode 162, the source electrode 108 and the drain electrode 110. The pixel electrode 122 is formed from a transparent conductive film at the pixel area 105 and connected directly to the drain electrode 110 of the thin film transistor 130.

A vertical electric field can be formed between the pixel electrode 122 to which a pixel signal is applied via the thin film transistor 130 and a common electrode (not shown) supplied with a reference voltage. Such an electric field rotates liquid crystal molecules between the color filter array substrate and the thin film transistor array substrate due to dielectric anisotropy of the liquid crystal molecules. Transmittance of light in the pixel area 105 can be differentiated by the extent of rotation of the liquid crystal molecules so that a gray level scale can be implemented.

The storage capacitor 140 includes the gate line 102 overlapped by the active layer 114, the ohmic contact layer 116, and a storage electrode 128. A gate insulating film 112 is positioned between the active layer 114 and the gate line 102. The storage electrode 128 is directly connected to the pixel electrode 122. The storage capacitor 140 allows a pixel signal applied on the pixel electrode 122 to be stably maintained until the next pixel signal is applied.

The gate pad 150 is connected to a gate driver (not shown) for applying a gate signal generated by the gate driver to the gate line 120. The gate pad 150 extends from the gate line 102. The data pad 160 is connected to a data driver (not shown) for applying a data signal generated by the data driver to the data line 104. The data pad 160 includes a lower data pad electrode 162 extending from the data line 104 and an upper data pad electrode 164 connected directly to the lower data pad electrode 162.

Figure 6A:
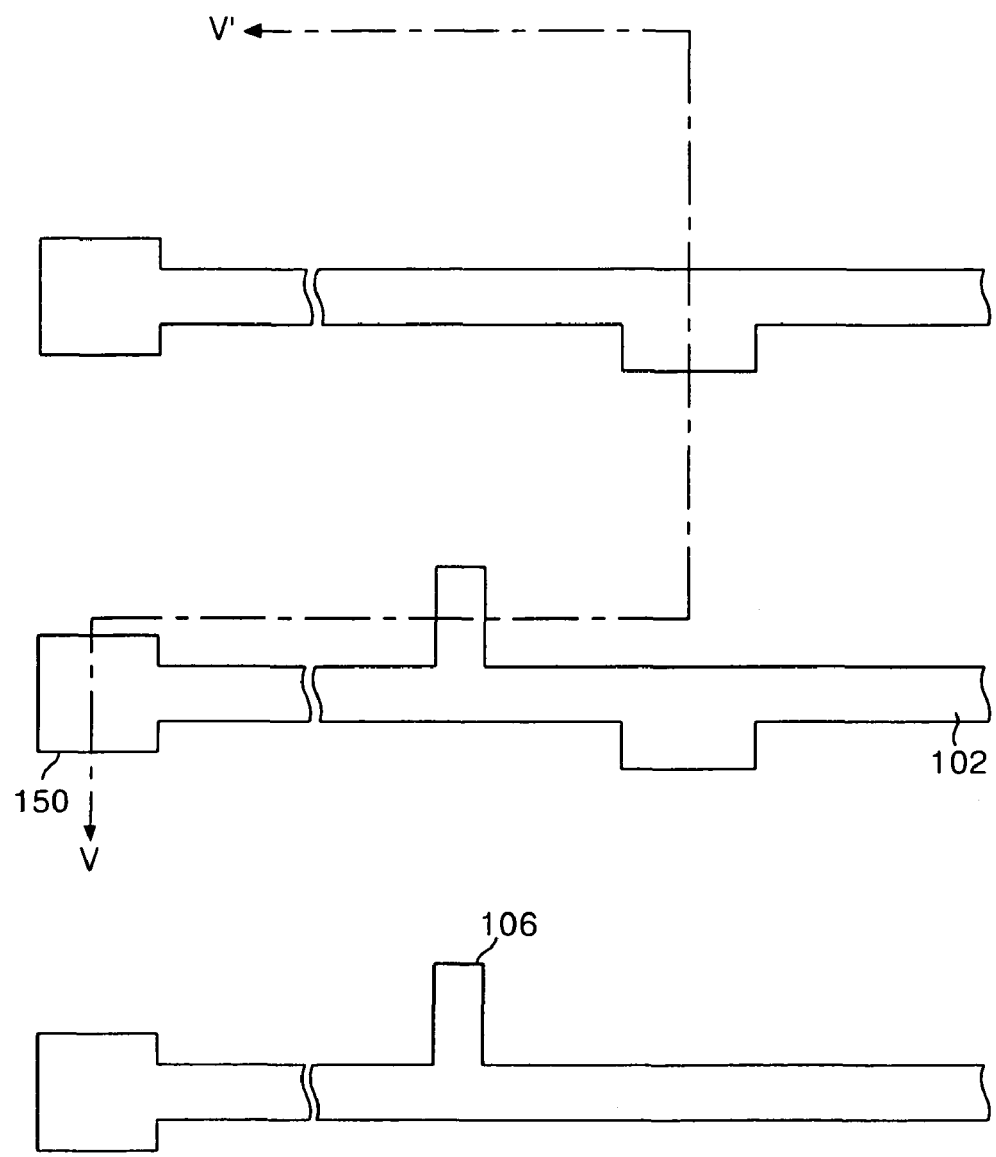
FIG. 6A and FIG. 6B are a plan view and a cross-sectional view, respectively, for explaining a first mask process in a method of fabricating the thin film transistor array substrate according to the first exemplary embodiment of the present invention.
Figure 6B:
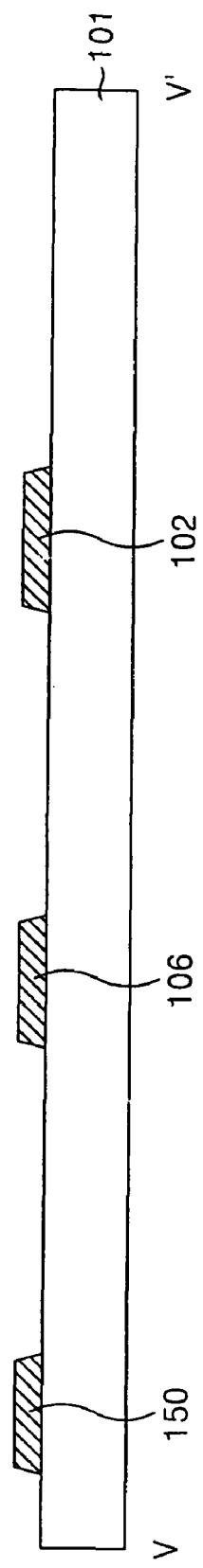

FIG. 6A and FIG. 6B are a plan view and a cross-sectional view, respectively, for explaining a first mask process in a method of fabricating the thin film transistor array substrate according to the first exemplary embodiment of the present invention. As shown in FIG. 6A and FIG. 6B, a first conductive pattern group including the gate line 102, the gate electrode 106 and the gate pad 150 are formed on the lower substrate 101 by a first mask process. More specifically, a gate metal layer is formed on the lower substrate 101 by a deposition technique, such as sputtering. The gate metal layer is made from a metal, such as molybdenum (Mo), copper (Cu), chrome (Cr), tantalum (Ta), titanium (Ti) or an aluminum group metal, including aluminum/neodymium (AlNd). Then, the gate metal layer is patterned by a photolithography and an etching process using a first mask to form the first conductive pattern group, including the gate line 102, the gate electrode 106 and the gate pad 150.

Figure 7A:
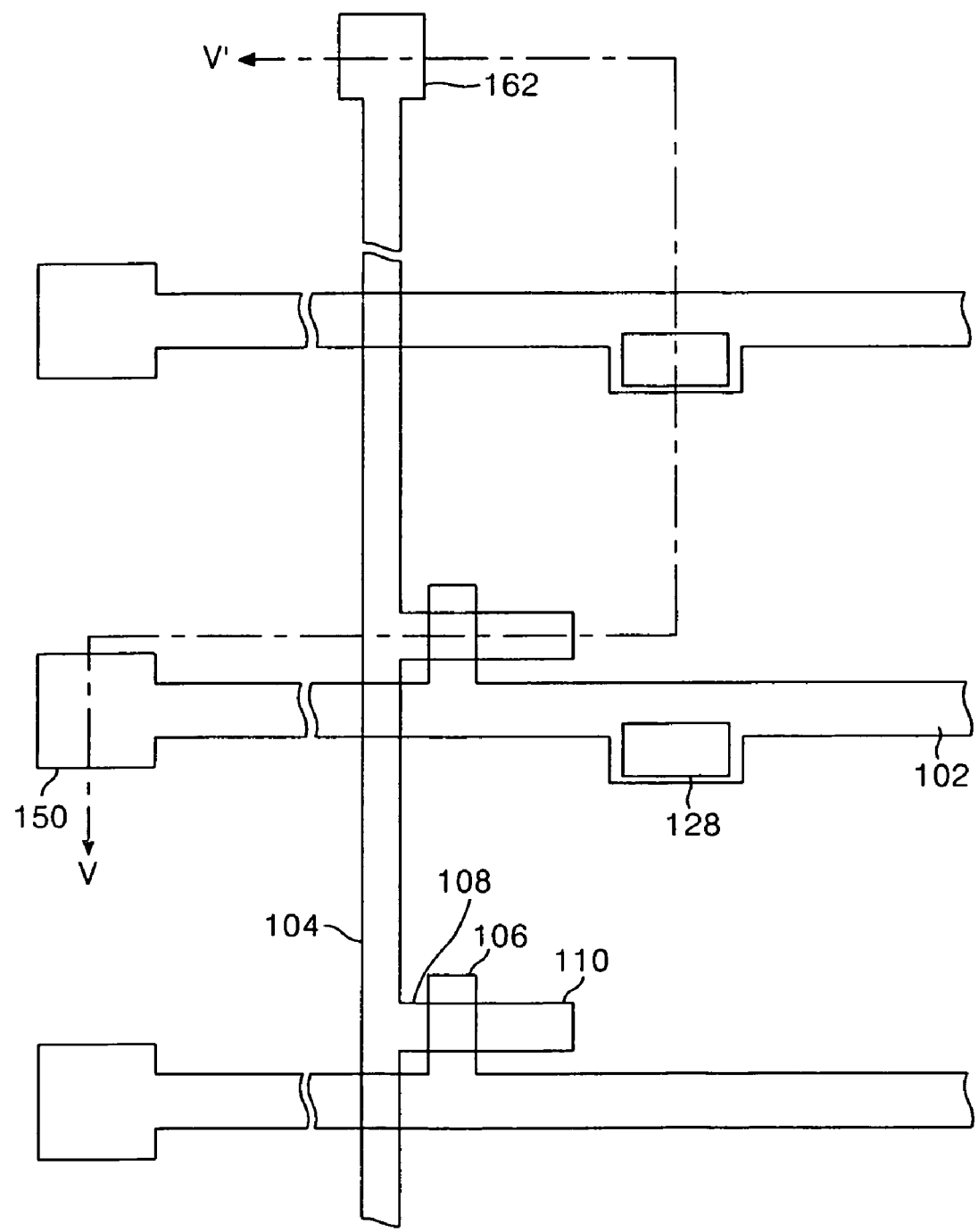

FIG. 7A and FIG. 7B are a plan view and a cross-sectional view, respectively, for explaining a second mask process in a method of fabricating the thin film transistor array substrate according to the first exemplary embodiment of the present invention. As shown in FIG. 7A and FIG. 7B, a gate insulating film 112 and a semiconductor pattern, including the active layer 114 and the ohmic contact layer 116, and a second conductive pattern group, including the data line 104 with integral source and drain electrodes 108 and 110, the storage electrode 128 and the lower data pad electrode 162 are formed on the lower substrate 101 having the first conductive pattern group by a second mask process. More specifically, the gate insulating film 112, the first and second semiconductor layers and the data metal layer are sequentially formed on the lower substrate 101 provided with the first conductive pattern group by a deposition technique, such as PEVCD, sputtering or the like. The gate insulating film 112 is formed from an inorganic insulating material, such as silicon nitride ($SiN_x$) or silicon oxide ($SiO_x$). The first semiconductor layer is formed from undoped amorphous silicon while the second semiconductor layer is formed from amorphous silicon doped with an N-type or P-type impurity. The data metal layer is made from a metal, such as molybdenum (Mo) or copper (Cu).

Subsequently, the data metal layer is patterned by photolithography, and any one of dry etching and wet etching using a second mask to provide the second conductive pattern group, including the data line 104, the source and drain electrodes 108 and 110, the storage electrode 128 and the lower data pad electrode 162. The first and second semiconductor layers are patterned by the dry etching process using the second conductive pattern group as a mask to form the active layer 114 and the ohmic contact layer 116.

Figure 8A:
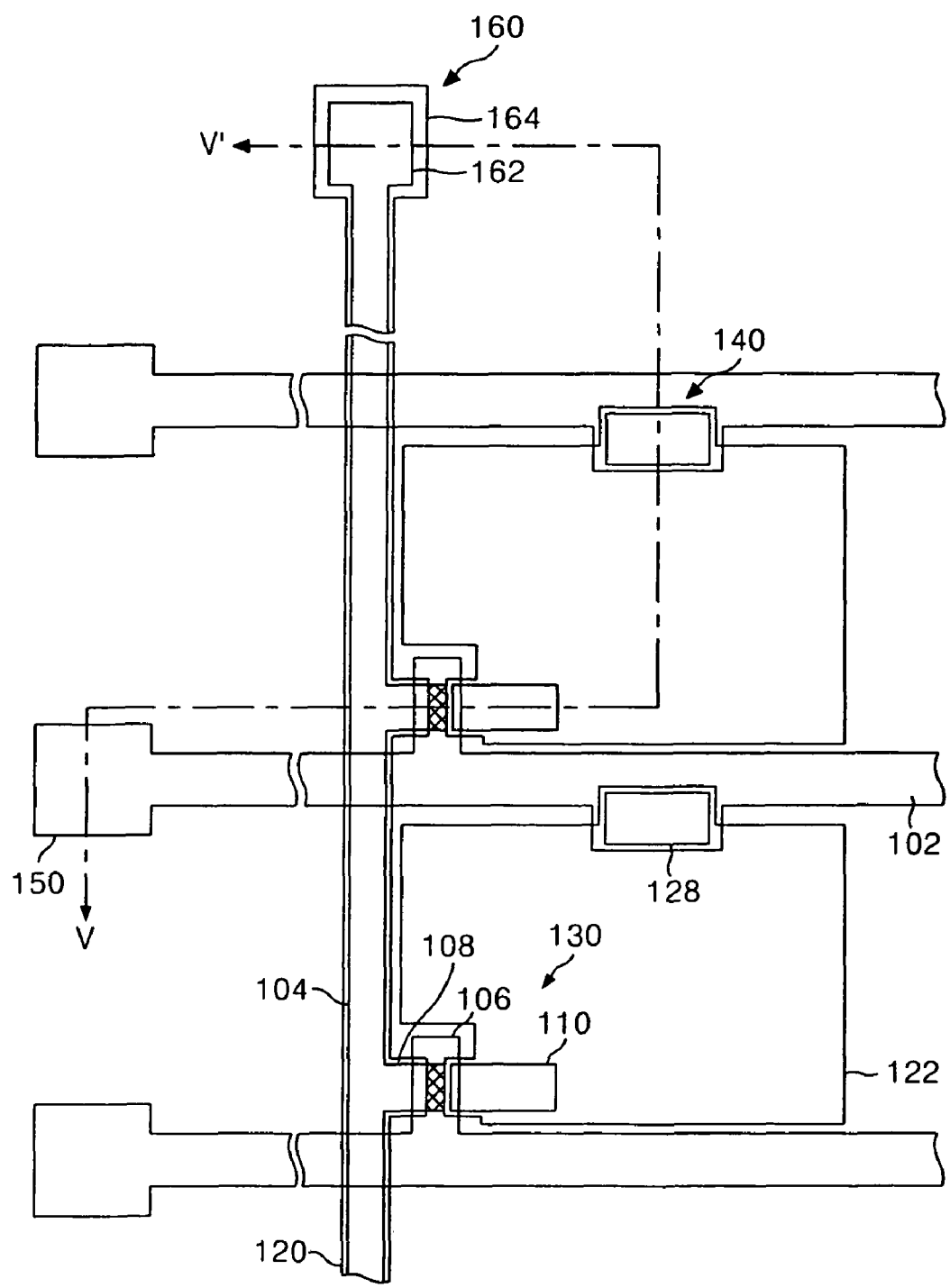
FIG. 8A and FIG. 8B are a plan view and a cross-sectional view, respectively, for explaining a third mask process in a method of fabricating the thin film transistor array substrate according to the first exemplary embodiment of the present invention.
Figure 8B:
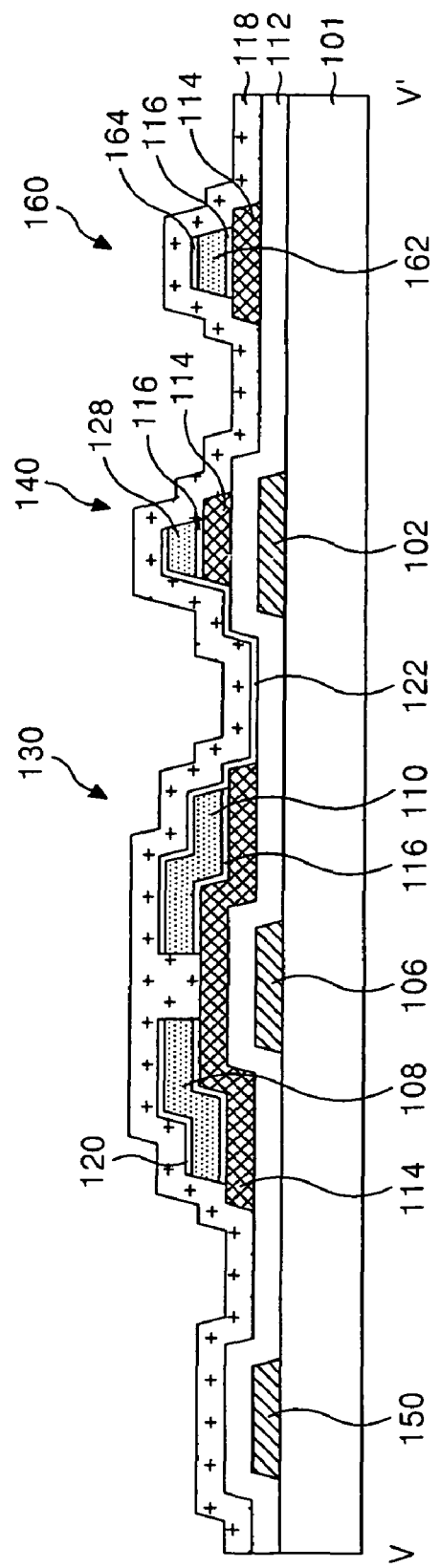

FIG. 8A and FIG. 8B are a plan view and a cross-sectional view, respectively, for explaining a third mask process in a method of fabricating the thin film transistor array substrate according to the first exemplary embodiment of the present invention. As shown in FIG. 8A and FIG. 8B, a third pattern group, including the pixel electrode 122, the transparent conductive pattern 120 and the upper data pad electrode 164, is formed on the lower substrate 101 having the second conductive pattern group and the semiconductor pattern by the third mask process. Further, the second conductive pattern group and the ohmic contact layer 116 located, along the third conductive pattern group, at the lower portion thereof are etched and removed. More particularly, the integral source and drain electrodes 108 and 110 of the thin film transistor are disconnected from each other and the ohmic contact layer 116 is removed to expose the active layer 114.

The transparent conductive film is formed on the lower substrate 101 provided with the semiconductor pattern and the second conductive pattern group by a deposition technique, such as sputtering. The transparent conductive film is made from one of ITO, TO, ITZO and IZO. Then, the transparent conductive film is patterned by the photolithography and the etching process using the third mask to provide the third conductive pattern group including the pixel electrode 122, the transparent conductive pattern 120 and the upper data pad electrode 164.

The second conductive pattern group is removed by the dry or wet etching process using the third conductive pattern group as a mask while the ohmic contact layer 116 is removed by the dry etching process. Thus, the data metal layer and the ohmic contact layer 116 provided at the channel portion of the thin film transistor are removed to disconnect the drain electrode 110 from the source electrode 108. Subsequently, a protective film 118 is formed over the entire surface of the lower substrate 101 having the third pattern group. The protective film 118 is made from an inorganic insulating material identical to the gate insulating pattern 112, or an organic insulating material, such as an acrylic organic compound having a small dielectric constant, BCB (benzocyclobutene) or PFCB (perfluorocyclobutane).

Figure 9A:
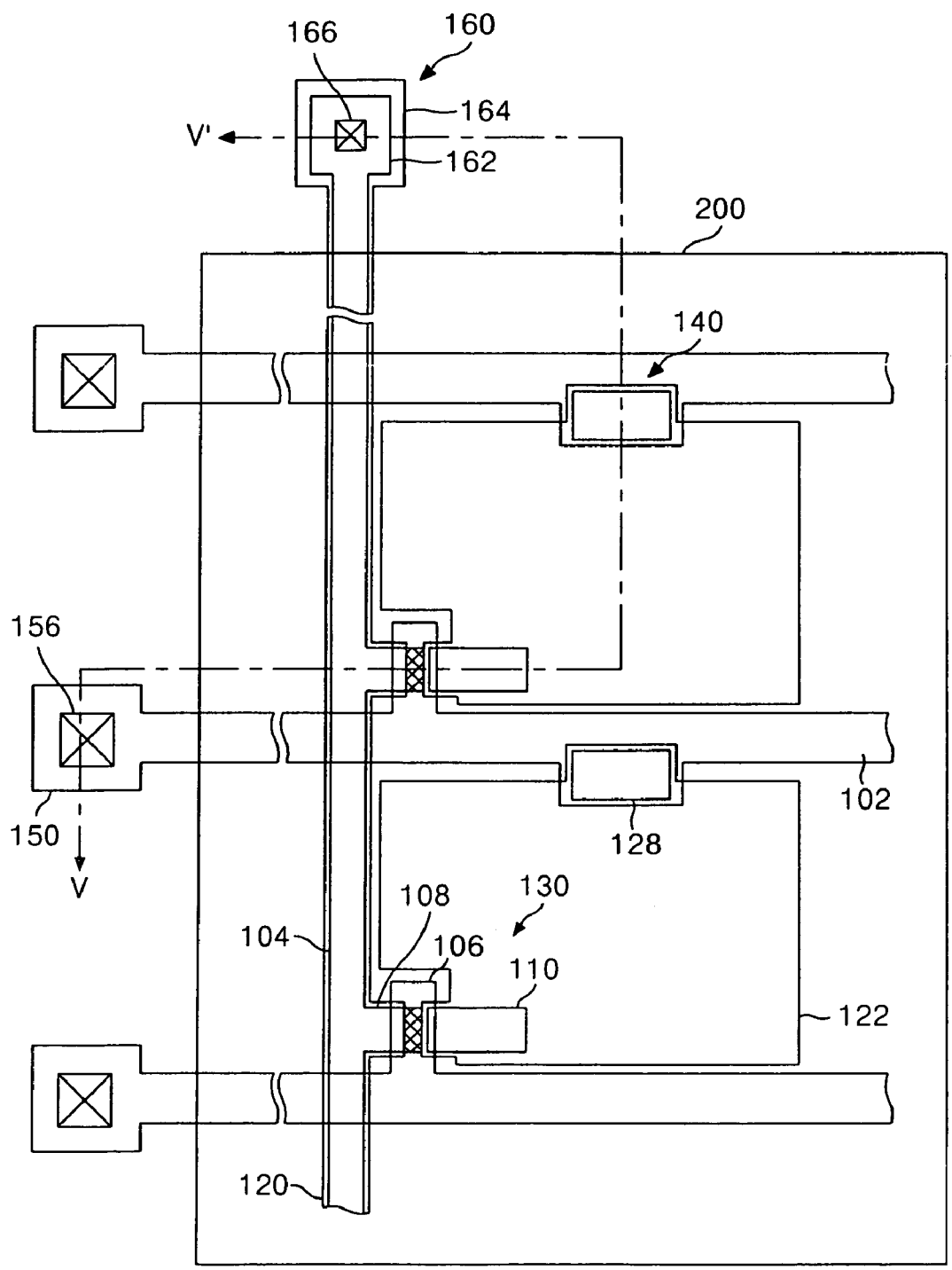
FIG. 9A to FIG. 9C are a plan view and cross-sectional views showing a structure of the liquid crystal display panel including the thin film transistor array substrate shown in FIG. 4 and FIG. 5.
Figure 9B:
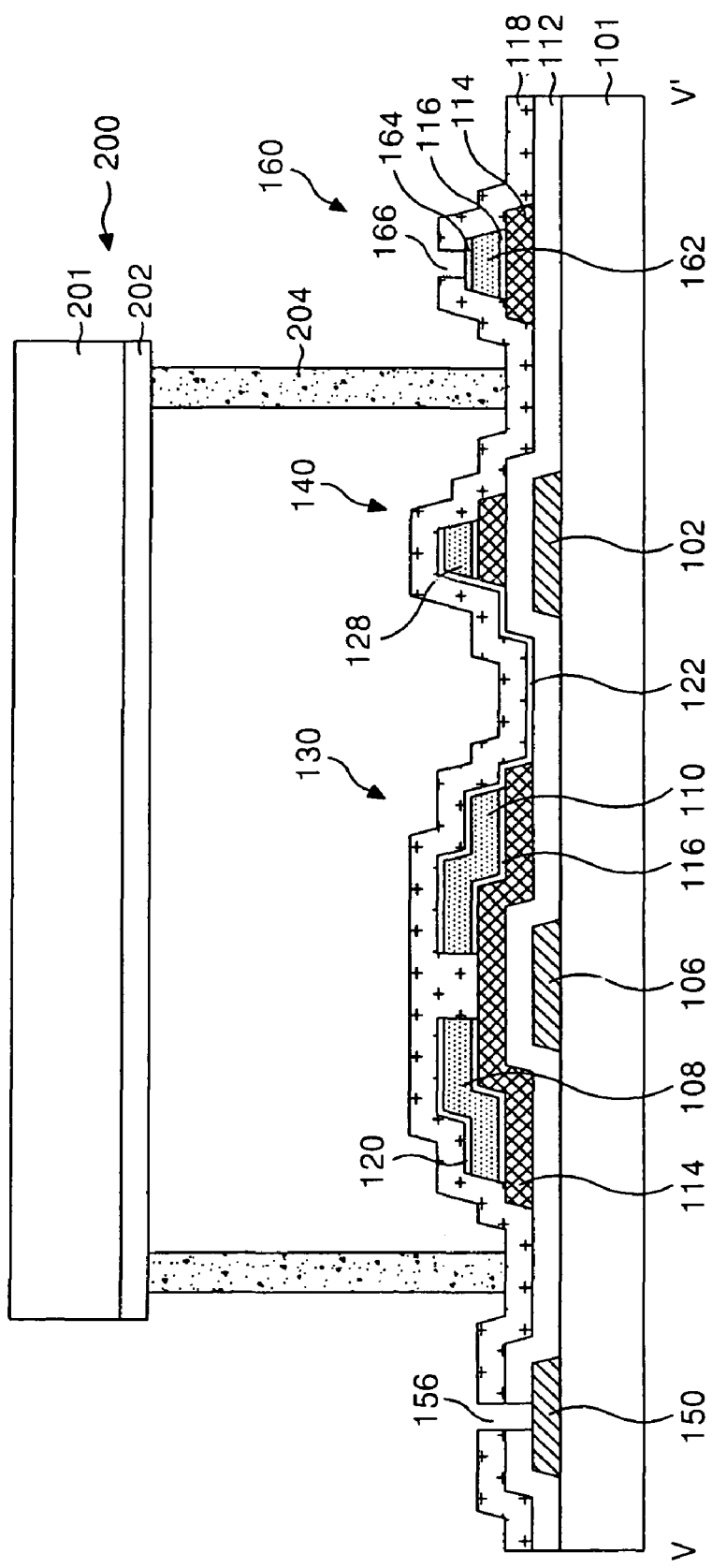
Figure 9C:
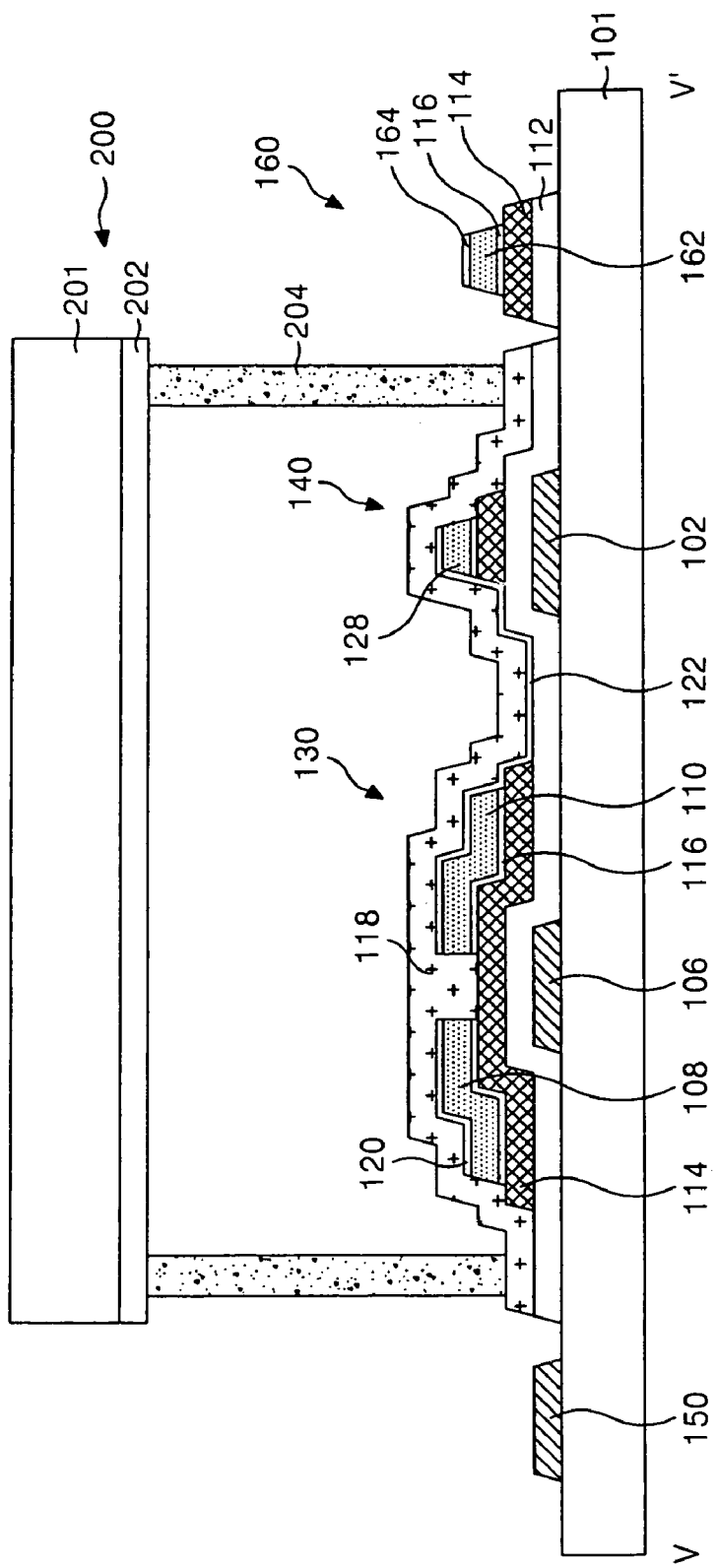

FIG. 9A to FIG. 9C are a plan view and cross-sectional views showing a structure of the liquid crystal display device including the thin film transistor array substrate according to the first exemplary embodiment of the present invention. The liquid crystal display device shown in FIG. 9A to FIG. 9C is completed by joining a thin film transistor array substrate 210 according to the first exemplary embodiment of the present invention with a color filter array substrate 200 having a color filter array 202 provided on an upper substrate 201 using a sealant 204. In this case, the color filter array substrate 200 is joined in such a manner as to not overlap the pad area provided with the gate pad 150 and the data pad 160 on the thin film transistor array substrate.

Then, the gate insulating film 112 and/or the protective film 118 exposed by the color filter array substrate 200 is removed by a pad opening process to define both a gate contact hole 156 and a data pad contact hole 166. The gate contact hole 156 passes through the gate insulating film 112 and the protective film 118 to expose the gate pad 150. The data contact hole 166 passes through the protective film 118 to expose the upper data pad electrode 164. In this case, the gate contact hole 156 and the data contact hole 166 pass through the protective film 118 and the gate insulating film 112 in such a manner as to expose the surfaces of the gate pad 150 and the upper data pad electrode 164 as shown in FIG. 9B, or are formed in such a manner to completely remove the protective film 118 and the gate insulating film 112 at the pad area as shown in FIG. 9C.

Figure 10A:
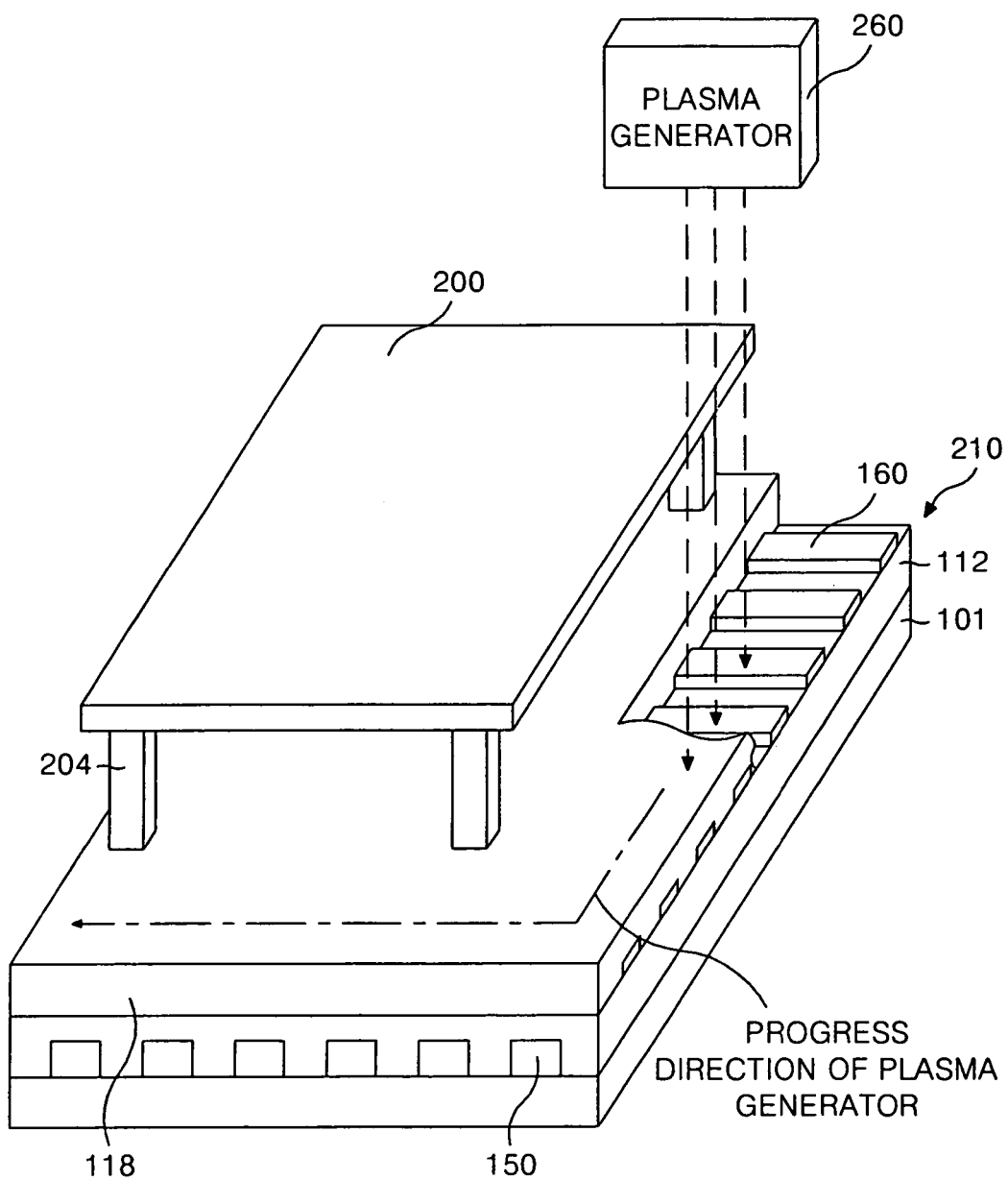
FIG. 10A to FIG. 10E are cross-sectional views for specifically explaining the pad opening process shown in FIG. 9A to FIG. 9C.
Figure 10B:
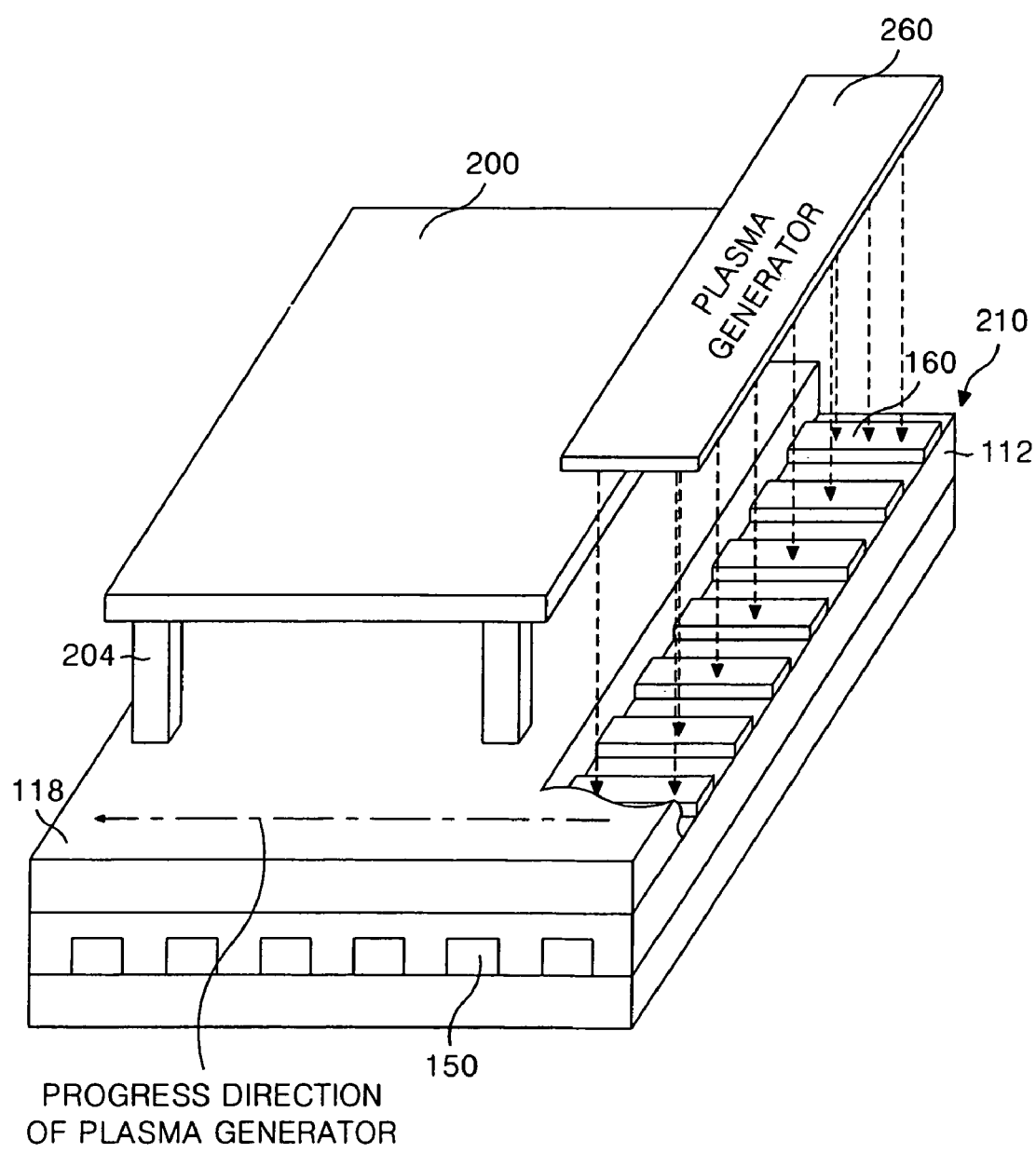
Figure 10C:
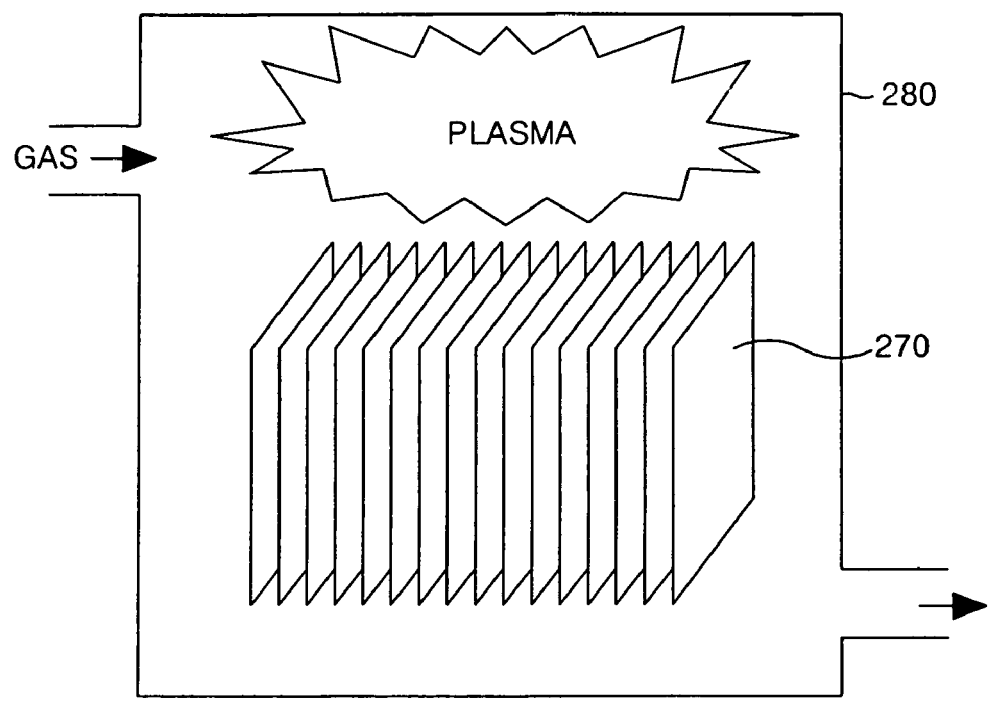
Figure 10D:
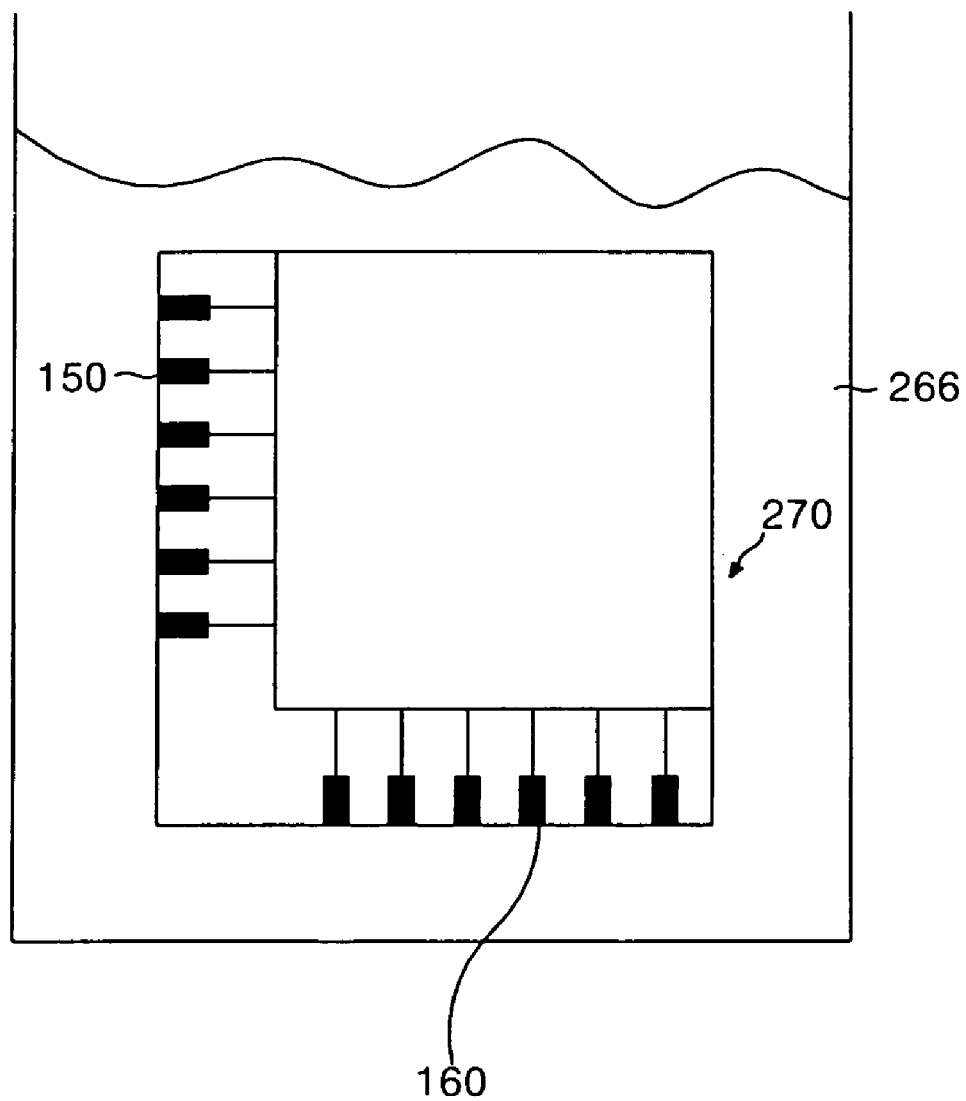
Figure 10E:
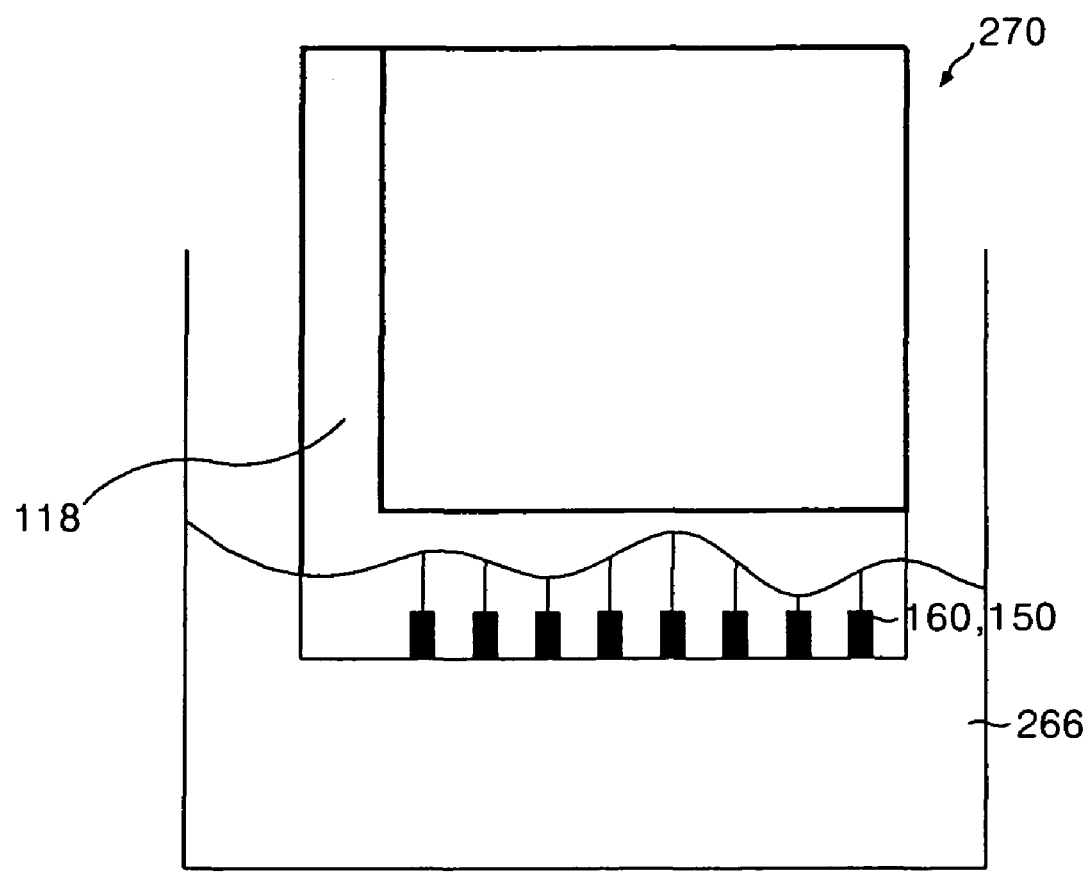

FIG. 10A to FIG. 10E are cross-sectional views for specifically explaining the pad opening process shown in FIG. 9A to FIG. 9C. The pad opening process can sequentially expose each pad 150 and 160 not overlapped by the color filter array substrate 200 as shown in FIG. 10A, or collectively exposes all of the pads as shown in FIG. 10B using a plasma generated by a plasma generator 260. In another alternative, a plurality of liquid crystal display panels 270 in which the color filter array substrate is joined to the thin film transistor array substrate are inserted into a chamber 180 and thereafter the gate insulating film 112 and the protective film 118 at the pad area exposed by the color filter array substrate are selectively etched by a normal pressure plasma as shown in FIG. 10C, to expose the gate pad 150 and the data pad 160. In yet another alternative, the entire liquid crystal display panel 270 in which the color filter array substrate is joined to the thin film transistor array substrate is dipped into an etchant liquid 266 as shown in FIG. 10D or only the pad area including the gate pad 150 and the data pad 160 is dipped into the etchant liquid 266 as shown in FIG. 10E, thereby exposing the gate pad 150 and the data pad 160. The pad opening process for exposing the pad may use the plasma generator as shown in FIG. 10A and FIG. 10B prior to the joining process, or may dip only the pad area into the etchant liquid as shown in FIG. 10E. In a further alternative, the pad opening process may be executed by an etching process using the alignment film as a mask prior to the joining process.

Figure 11:
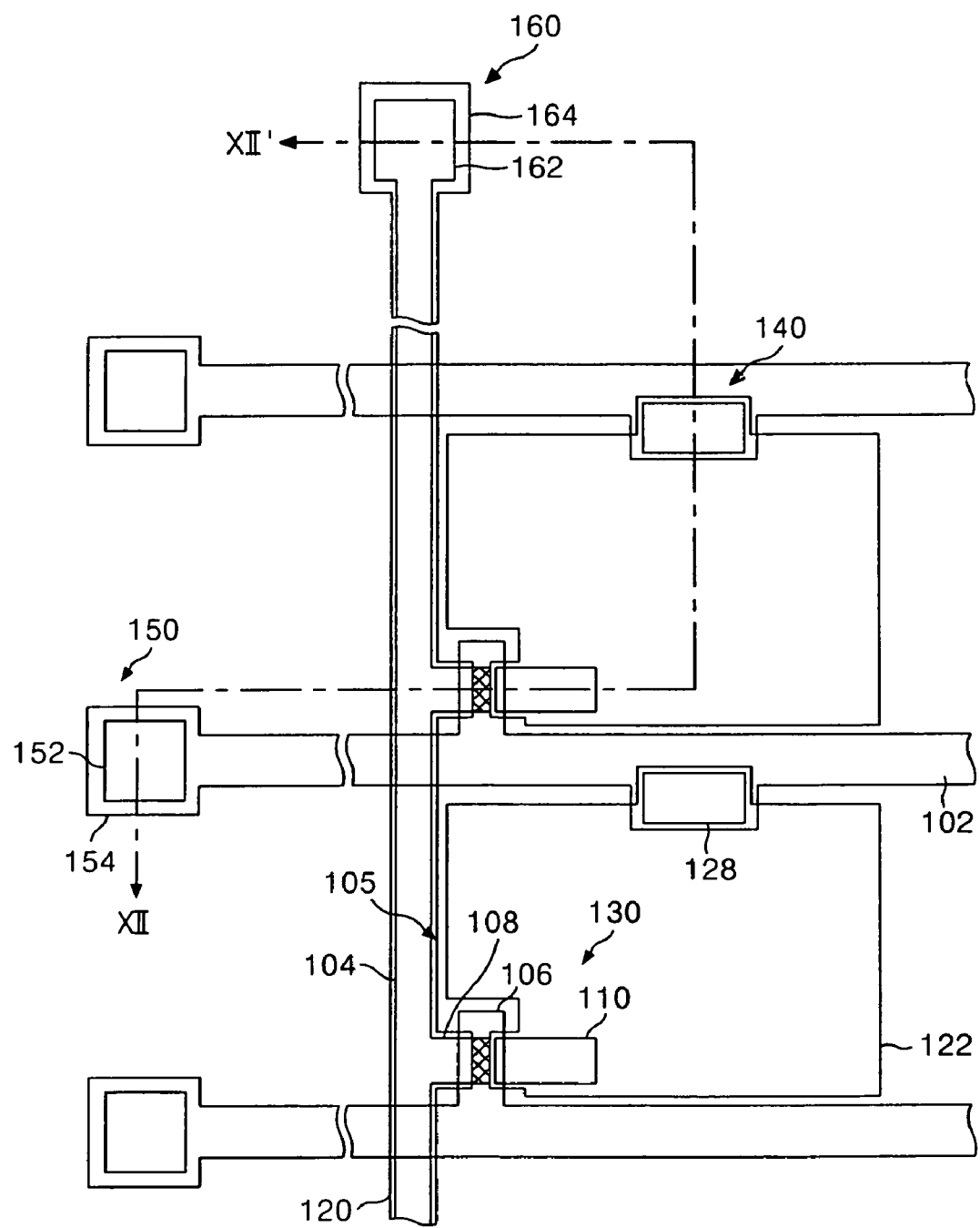
FIG. 11 is a plan view showing a structure of a thin film transistor array substrate of a liquid crystal display panel according to a second embodiment of the present invention.
Figure 12:
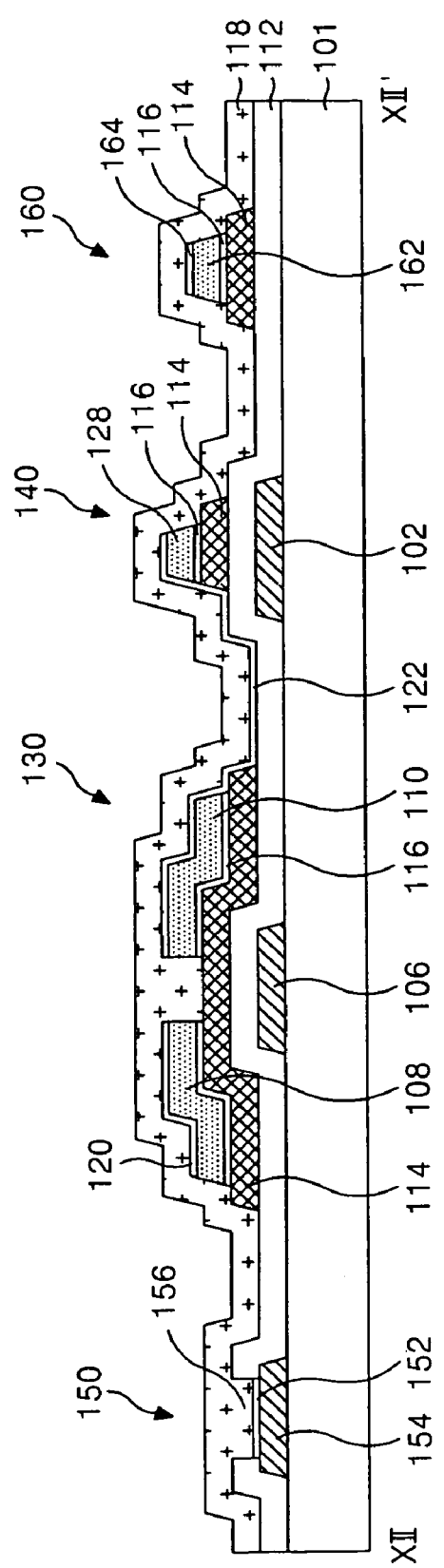
FIG. 12 is a cross-sectional view of the thin film transistor array substrate taken along line XII-XII' in FIG. 11.

FIG. 11 is a plan view showing a structure of a thin film transistor array substrate of a liquid crystal display panel according to a second exemplary embodiment of the present invention, and FIG. 12 is a cross-sectional view of the thin film transistor array substrate taken along line XII-XII' in FIG. 11. Referring to FIG. 11 and FIG. 12, the thin film transistor array substrate according to the second exemplary embodiment of the present invention has the same elements as the thin film transistor array substrate shown in FIG. 4 and FIG. 5 except that the gate pad 150 includes a lower gate pad electrode 154 and an upper gate pad electrode 152. Therefore, a detailed explanation of the same elements will be omitted.

The gate pad 150 is connected to a gate driver (not shown) for applying a gate signal generated from the gate driver to the gate line 120. The gate pad 150 includes a lower gate pad electrode 154 extending from the gate line 102, and an upper gate pad electrode 152 connected directly to the lower gate pad electrode 154. In the thin film transistor array substrate according to a second exemplary embodiment of the present invention, the gate pad 150 and the data pad 160 have an improved reliability to withstand corrosion because the upper gate pad electrode 152 and the upper data pad electrode 164 are made from a transparent conductive material having a strong corrosion resistance when exposed during etching. Further, the gate pad 150 and the data pad 160 formed in such a manner as to have an upper transparent conductive material layer are not prone to breakage during a repetitive attaching process of the tape carrier package (TCP).

Figure 13A:
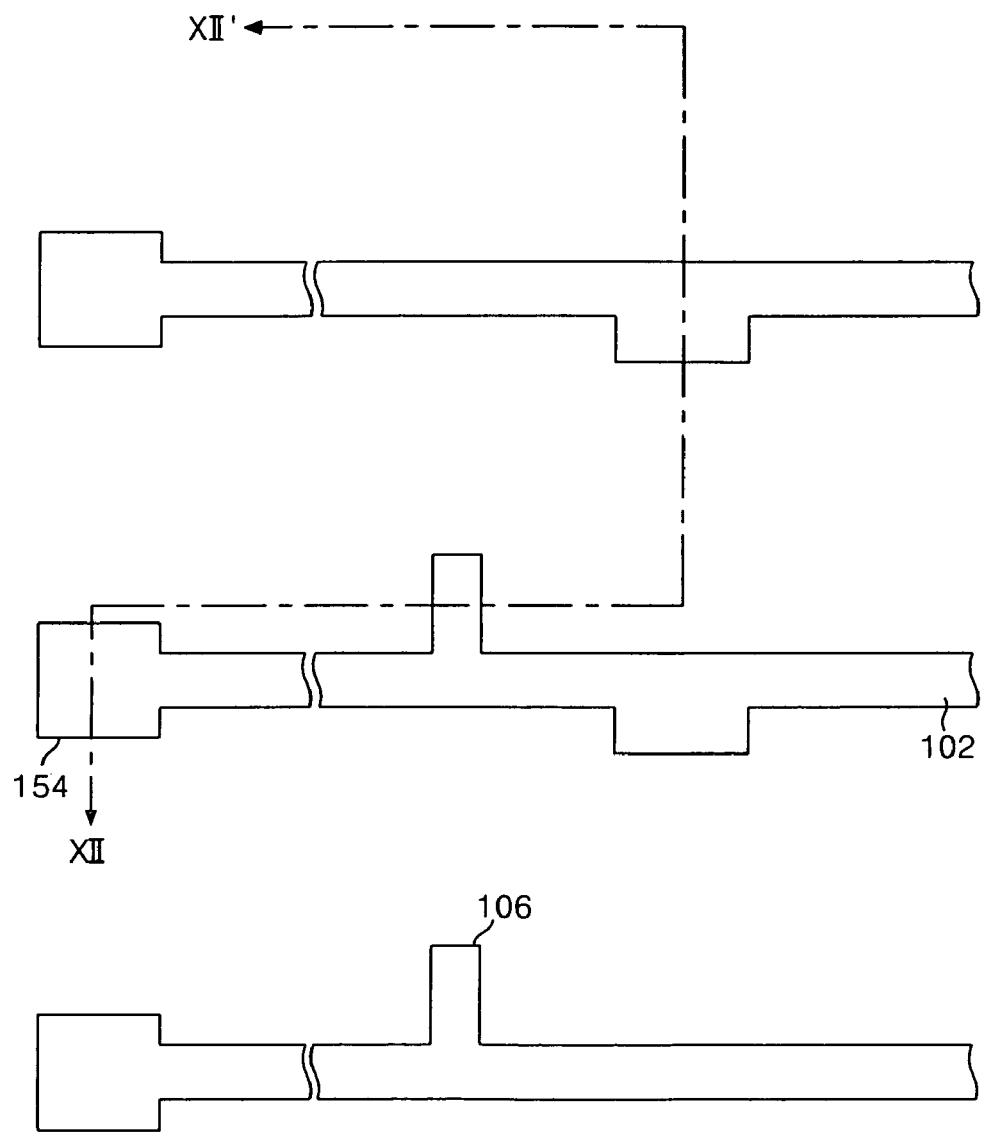
FIG. 13A and FIG. 13B are a plan view and a cross-sectional view, respectively, for explaining a first mask process in a method of fabricating the thin film transistor array substrate according to the second exemplary embodiment of the present invention.
Figure 13B:
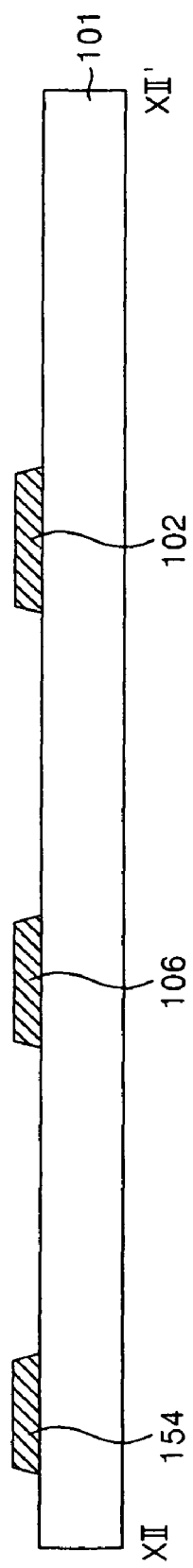

FIG. 13A and FIG. 13B are a plan view and a cross-sectional view, respectively, for explaining a first mask process in a method of fabricating the thin film transistor array substrate according to the second exemplary embodiment of the present invention. As shown in FIG. 13A and FIG. 13B, a first conductive pattern group, including the gate line 102, the gate electrode 106 and the gate pad 150, are formed on the lower substrate 101 by the first mask process. More specifically, a gate metal layer is formed on the lower substrate 101 by a deposition technique, such as sputtering. The gate metal layer is made from a metal, such as molybdenum (Mo), copper (Cu), chrome (Cr), tantalum (Ta), titanium (Ti) and an aluminum group metal including aluminum/neodymium (AlNd). Then, the gate metal layer is patterned by a photolithography and an etching process using a first mask to form the first conductive pattern group, including the gate line 102, the gate electrode 106 and the lower gate pad electrode 154.

Figure 14A:
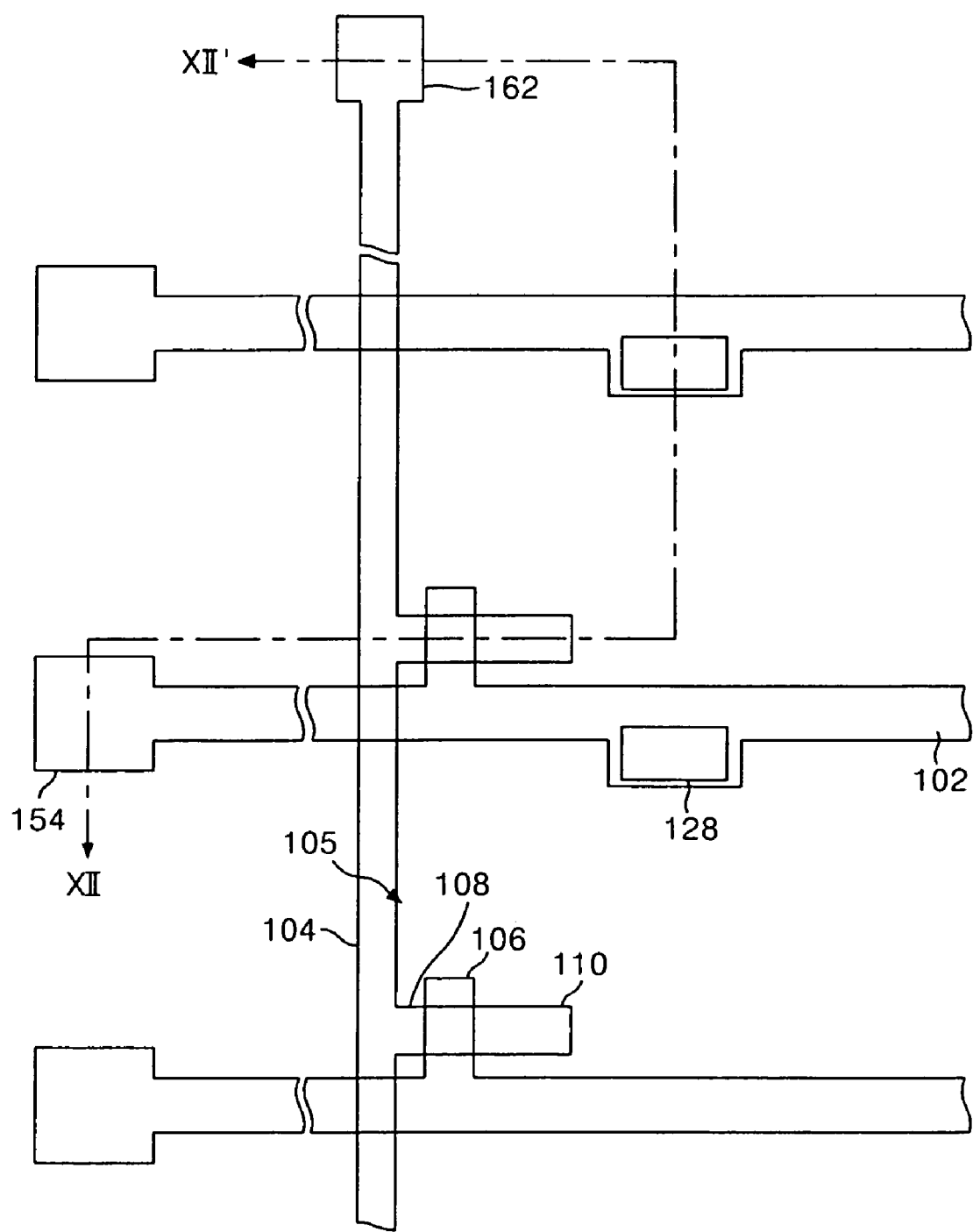
FIG. 14A and FIG. 14B are a plan view and a cross-sectional view, respectively, for explaining a second mask process in a method of fabricating the thin film transistor array substrate according to the second exemplary embodiment of the present invention.
Figure 14B:
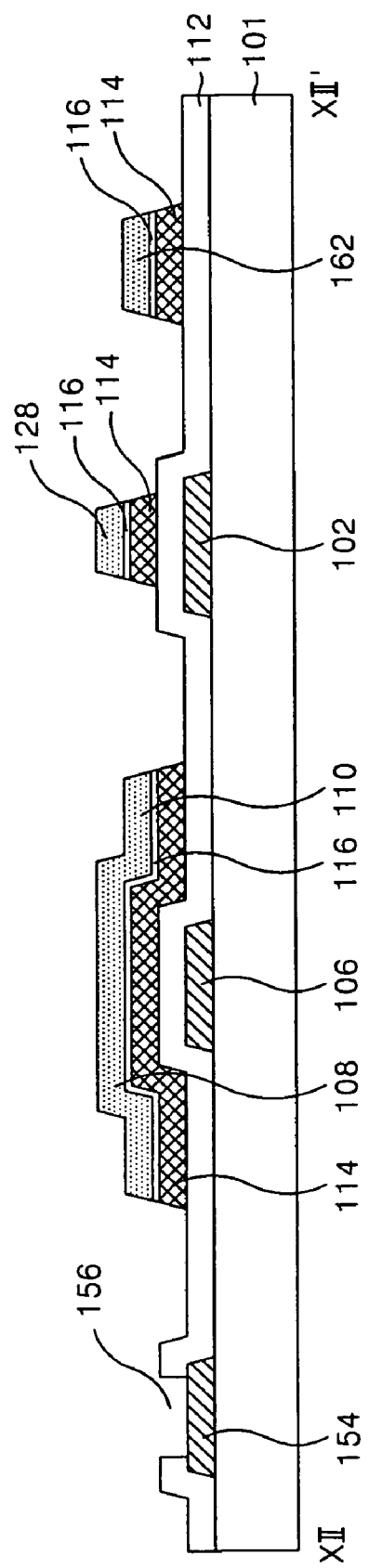

FIG. 14A and FIG. 14B are a plan view and a cross-sectional view, respectively, for explaining a second mask process in a method of fabricating the thin film transistor array substrate according to the second exemplary embodiment of the present invention. As shown in FIG. 14A and FIG. 14B, a gate insulating film 112, a semiconductor pattern, including the active layer 114 and the ohmic contact layer 116, and a second conductive pattern group, including the data line 104 with integral source and drain electrodes 108 and 110, the storage electrode 128 and the lower data pad electrode 162, are formed on the lower substrate 101 having the first conductive pattern group by a second mask process. More specifically, the gate insulating film 112, the first and second semiconductor layers and the data metal layer are sequentially formed on the lower substrate 101 provided with the first conductive pattern group by a deposition technique, such as PEVCD, sputtering or the like. The gate insulating film 112 is formed from an inorganic insulating material, such as silicon nitride ($SiN_x$) or silicon oxide ($SiO_x$). The first semiconductor layer is formed from an undoped amorphous silicon while the second semiconductor layer is formed from amorphous silicon doped with an N-type or P-type impurity. The data metal layer is made from a metal, such as molybdenum (Mo) or copper (Cu).

The data metal layer is patterned by photolithography and any one of dry etching and wet etching using a second mask to provide the second conductive pattern group including the data line 104, the source and drain electrodes 108 and 110, the storage electrode 128 and the lower data pad electrode 162. The first and second semiconductor layers are also patterned by the dry etching process using the second conductive pattern group as a mask to form the active layer 114 and the ohmic contact layer 116. Then, the gate insulating film 112 on the lower gate pad electrode 154 is selectively removed by using the plasma generator shown in FIG. 10A and FIG. 10B or selectively dipping only the gate pad area into the etchant liquid shown in FIG. 10. Thus, a first gate contact hole 156 for exposing the lower gate pad electrode 154 can be formed.

Figure 15A:
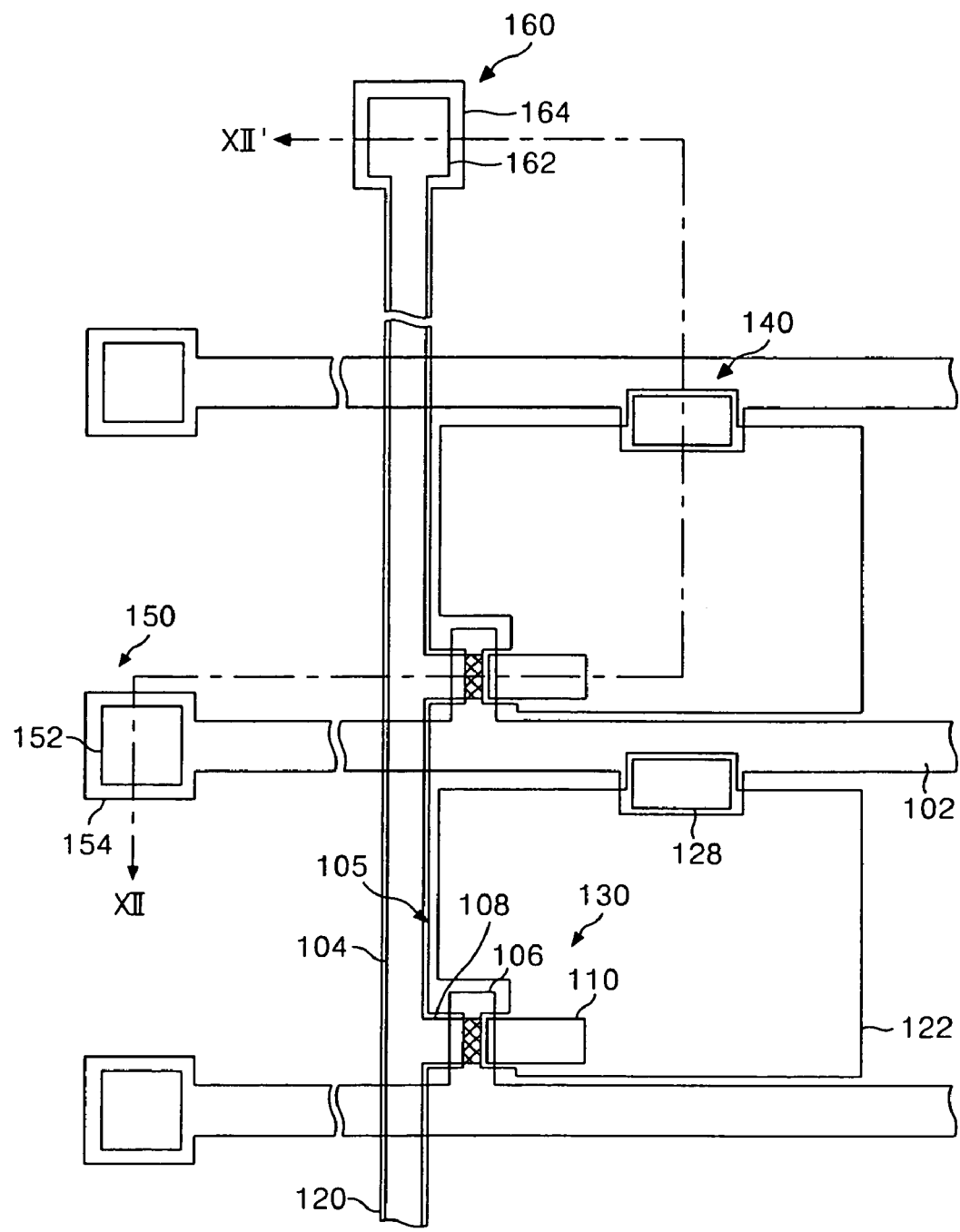
FIG. 15A and FIG. 15B are a plan view and a cross-sectional view, respectively, for explaining a third mask process in a method of fabricating the thin film transistor array substrate according to the second exemplary embodiment of the present invention.
Figure 15B:
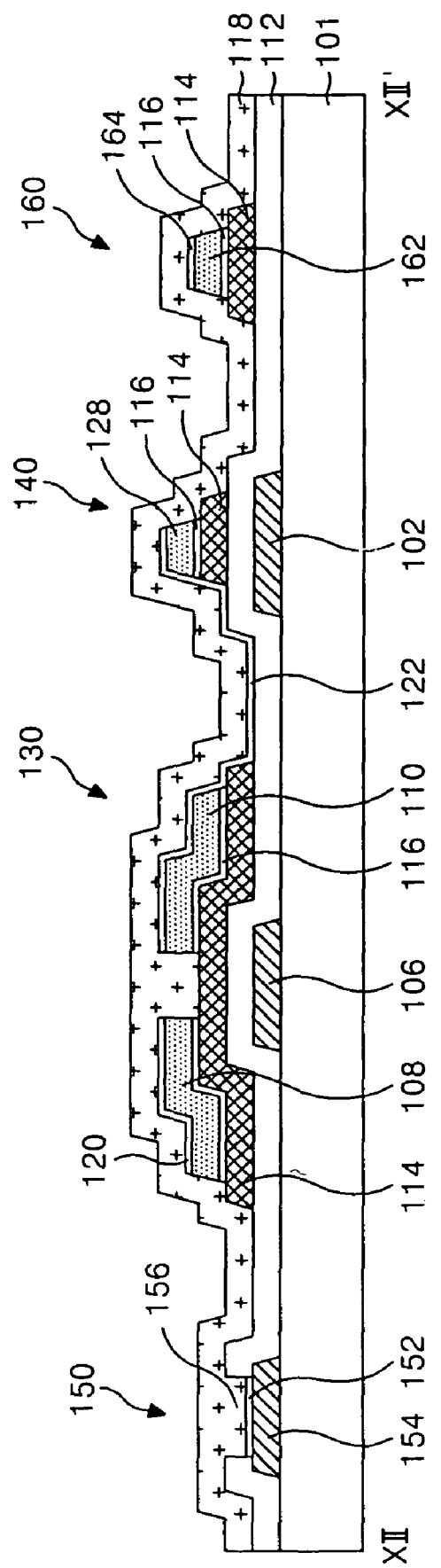

FIG. 15A and FIG. 15B are a plan view and a cross-sectional view, respectively, for explaining a third mask process in a method of fabricating the thin film transistor array substrate according to the second exemplary embodiment of the present invention. As shown in FIG. 15A and FIG. 15B, a third pattern group, including the pixel electrode 122, the transparent conductive pattern 120, the upper data pad electrode 164 and the upper gate pad electrode 152, is formed on the lower substrate 101 provided with the second conductive pattern group and the semiconductor pattern by a third mask process. Further, the second conductive pattern group and the ohmic contact layer 116 located, along the third conductive pattern group, at the lower portion thereof are etched and removed. More particularly, the integral source and drain electrodes 108 and 110 of the thin film transistor are disconnected from each other and the ohmic contact layer 116 is removed, thereby exposing the active layer 114.

To this end, a transparent conductive film is formed on the lower substrate 101 provided with the semiconductor pattern and the second conductive pattern group by a deposition technique, such as sputtering. The transparent conductive film is made from any one of ITO, TO, ITZO and IZO. Then, the transparent conductive film is patterned by a photolithography and an etching process using the third mask to thereby provide the third conductive pattern group, including the pixel electrode 122, the transparent conductive pattern 120, the upper data pad electrode 164 and the upper gate pad electrode 152. Further, the second conductive pattern group is removed by the dry or wet etching process using the third conductive pattern group as a-mask while the ohmic contact layer 116 is removed by the dry etching process. More particularly, the data metal layer and the ohmic contact layer 116 provided at the channel portion of the thin film transistor are removed to disconnect the drain electrode 110 from the source electrode 108.

Subsequently, a protective film 118 is formed over the entire surface of the lower substrate 101 having the third pattern group. The protective film 118 is made from an inorganic insulating material identical to the gate insulating pattern 112, or an organic insulating material, such as an acrylic organic compound having a small dielectric constant, BCB (benzocyclobutene) or PFCB (perfluorocyclobutane).

Figure 16A:
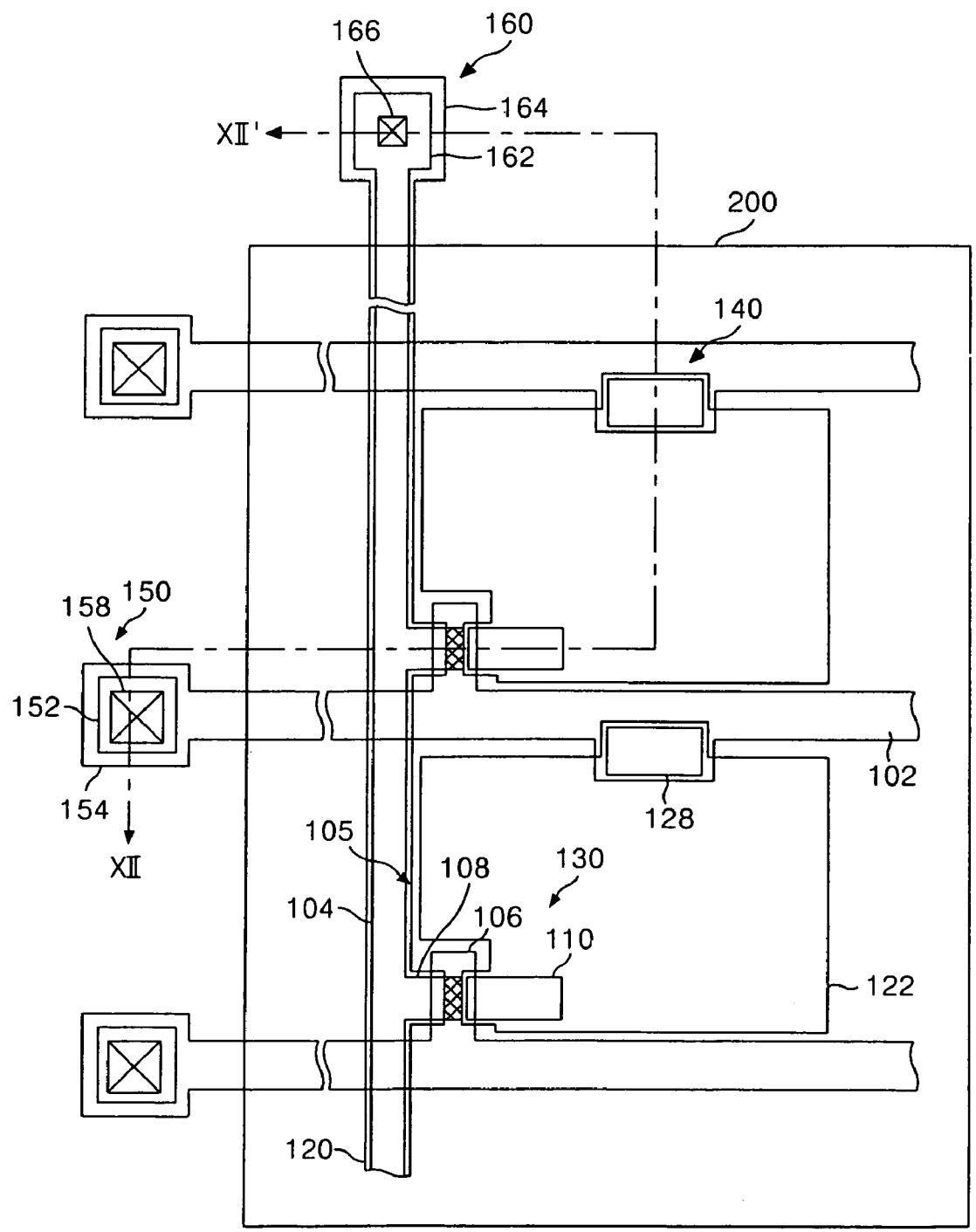
FIG. 16A to FIG. 16C are a plan view and cross-sectional views, respectively, showing a structure of the liquid crystal display panel including the thin film transistor array substrate shown in FIG. 11 and FIG. 12.
Figure 16B:
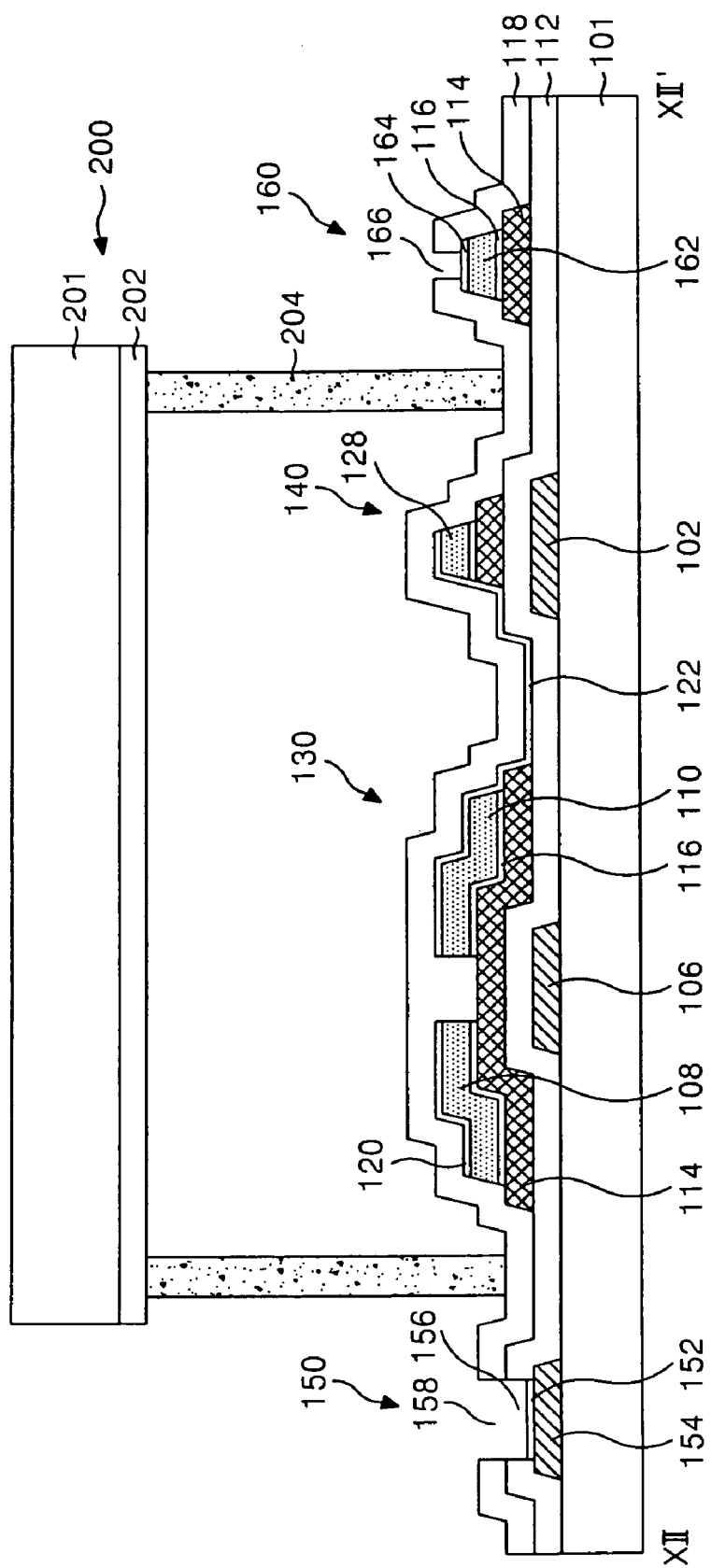
Figure 16C:
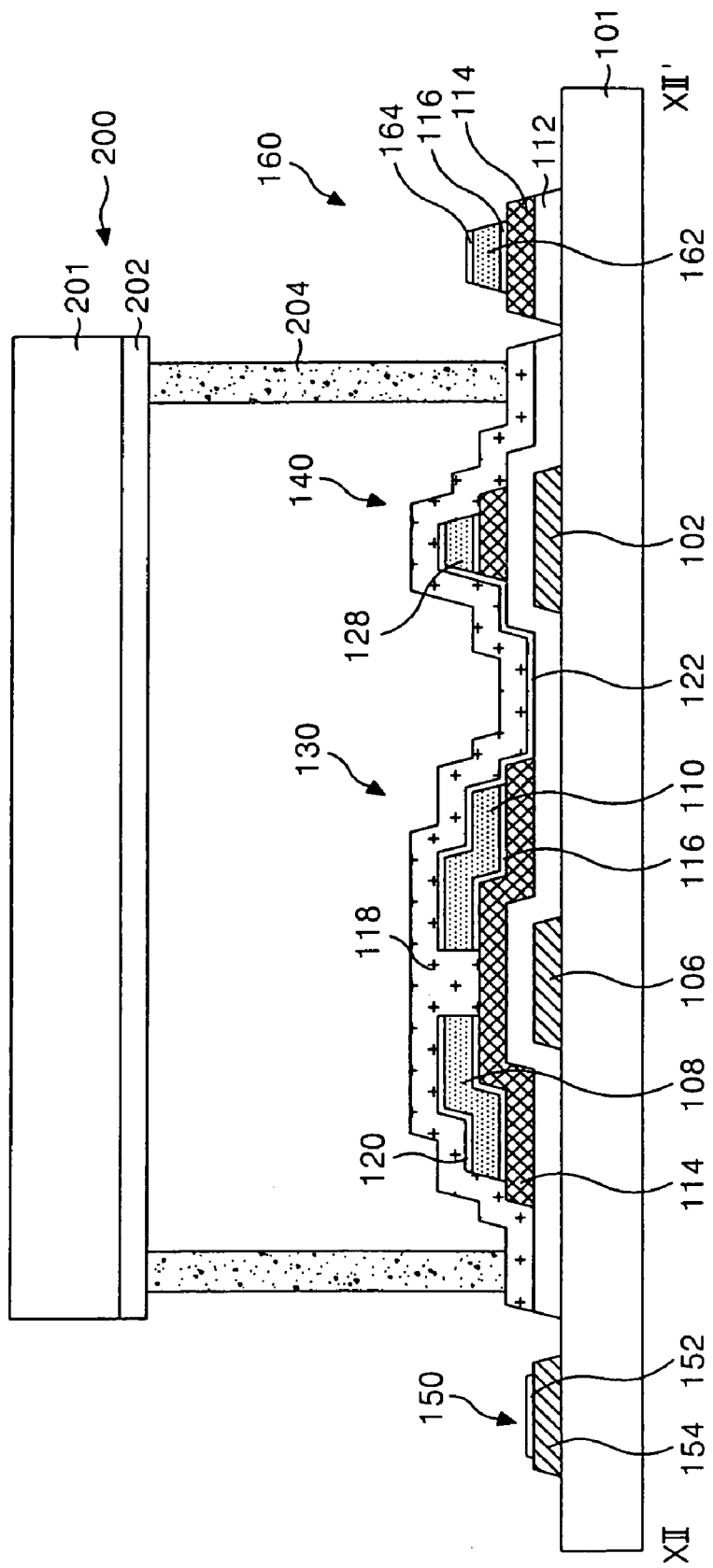

FIG. 16A to FIG. 16C are a plan view and cross-sectional views showing a structure of the liquid crystal display device including the thin film transistor array substrate according to the second exemplary embodiment of the present invention. The liquid crystal display device shown in FIG. 16A to FIG. 16C is completed by joining a thin film transistor array substrate 210 according to the second exemplary embodiment of the present invention with a color filter array substrate 200 having a color filter array 202 provided on an upper substrate 201 using a sealant 204. In this case, the color filter array substrate 200 is joined in such a manner as to not overlap the pad area having the gate pad 150 and the data pad 160 on the thin film transistor array substrate.

Then, the protective film 118 exposed by the color filter array substrate 200 is removed by one of the pad opening processes shown in FIG. 10A to FIG. 10E to form a second gate contact hole 158 and a data contact hole 166. The second gate contact hole 158 passes through the protective film 118 to expose the upper gate pad electrode 152. The data contact hole 166 passes through the protective film 118 to expose the upper data pad electrode 164. The second gate contact hole 158 and the data contact hole 166 can be formed by completely removing the protective film 118 at the pad area, or by selectively removing the protective film 118 positioned on the upper gate pad electrode 152 and the upper data pad electrode 164. The pad opening process for exposing the pad may use the plasma generator as shown in FIG. 10A and FIG. 10B prior to the joining process, or may dip only the pad area into the etchant liquid as shown in FIG. 10E. Alternatively, the pad opening process may be executed by an etching process using the alignment film as a mask prior to the joining process.

FIG. 17 is a plan view showing a structure of a thin film transistor array substrate of a liquid crystal display panel according to a third exemplary embodiment of the present invention. As shown in FIG. 17, the thin film transistor array substrate according to the third exemplary embodiment of the present invention has some of the same elements as the thin film transistor array substrate shown in FIG. 11 and FIG. 12 except that the gate insulating pattern is not formed over the entire lower substrate 101.

The gate insulating pattern 180 is formed on the lower substrate 101 only at areas between the first conductive pattern group and the semiconductor pattern along the semiconductor pattern. In other words, the gate insulating pattern 180 is formed just between the active layer 114 and the gate electrode 106 of the thin film transistor, the gate line 102 and the active layer 114 of the storage capacitor 140, and the active layer 114 and the lower substrate 101 at the data pad 160.

Such a gate insulating pattern 180 is formed to have a larger width than the semiconductor pattern to improve step coverage of the third conductive pattern group, including the pixel electrode 122, in such a manner as to cover the sides of the gate insulating pattern 180 and the semiconductor pattern. Further, the gate insulating pattern 180 is not formed in the pixel area and the lower substrate 101 directly contacts the pixel electrode, thereby improving transmittance of a light generated from the backlight unit and transmitting through the pixel electrode 122.

Figure 18A:
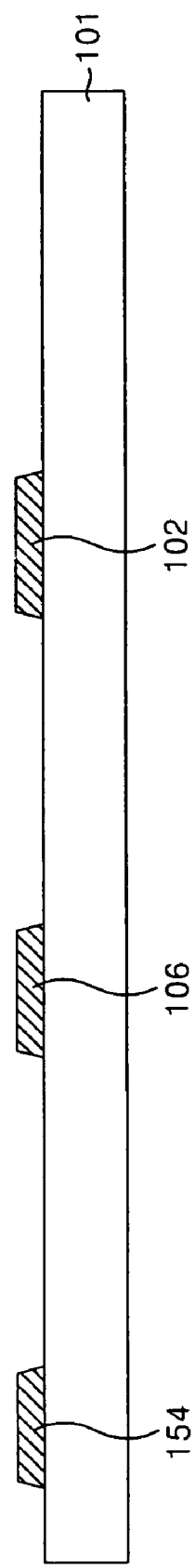
FIG. 18A to FIG. 18C are cross-sectional views for explaining a method of fabricating a thin film transistor array substrate according to a third exemplary embodiment of the present invention.
Figure 18B:
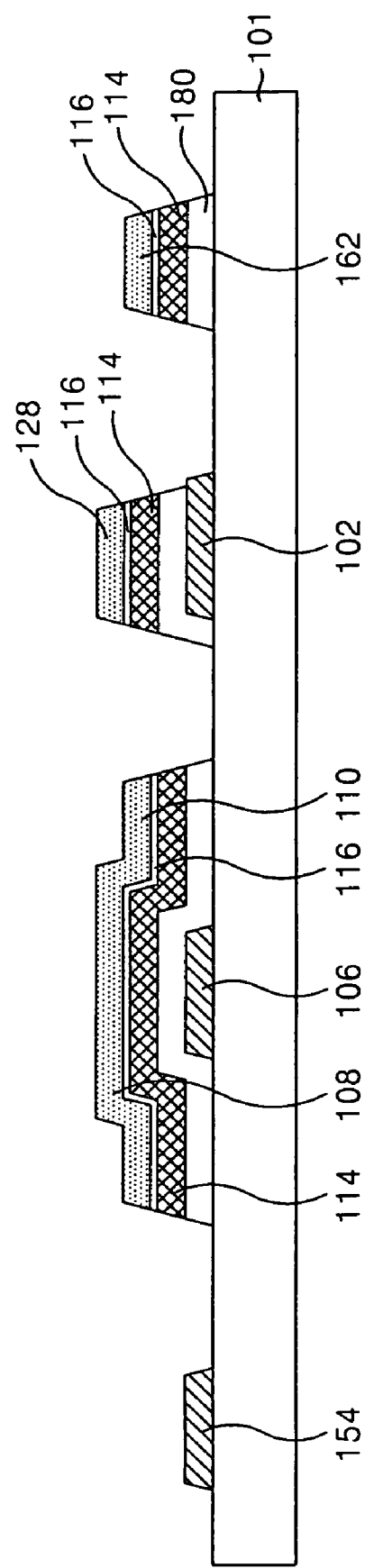
Figure 18C:
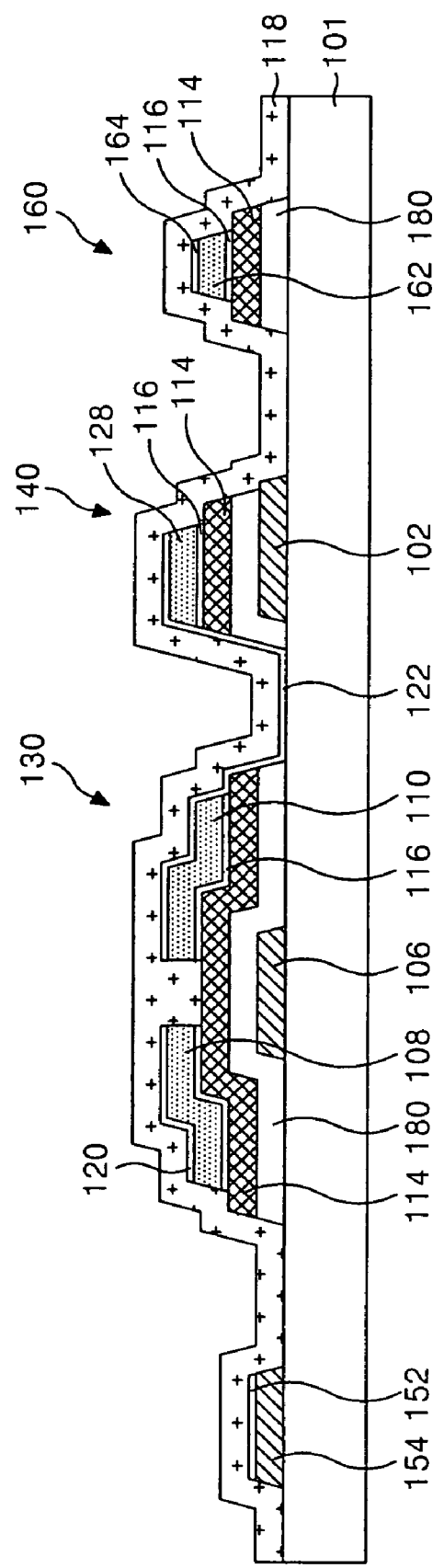

FIG. 18A to FIG. 18C are cross-sectional views for explaining a method of fabricating the thin film transistor array substrate according to the third exemplary embodiment of the present invention. Referring to FIG. 18A, a first conductive pattern group, including the gate line 102, the gate electrode 106 and the lower gate pad electrode 154 are formed on the lower substrate 101 by a first mask process. More specifically, a gate metal layer is formed on the lower substrate 101 by a deposition technique, such as sputtering. The gate metal layer is made from a metal, such as molybdenum (Mo), copper (Cu), chrome (Cr), tantalum (Ta), titanium (Ti) and an aluminum group metal, including aluminum/neodymium (AlNd). Then, the gate metal layer is patterned by a photolithography and an etching process using a first mask to form the first conductive pattern group, including the gate line 102, the gate electrode 106 and the lower gate pad electrode 154.

Referring to FIG. 18B, a gate insulating pattern 180, a semiconductor pattern, including the active layer 114 and the ohmic contact layer 116, and a second conductive pattern group, including the data line 104 with integral source and drain electrodes 108 and 110, the storage electrode 128 and the lower data pad electrode 162, are formed on the lower substrate 101 having the first conductive pattern group. More specifically, an insulating material, the first semiconductor layer and the second semiconductor layer and the data metal layer are sequentially formed on the lower substrate 101 having the first conductive pattern group by a deposition technique, such as PEVCD, sputtering or the like. The insulating material is an inorganic insulating material, such as silicon nitride ($SiN_x$) or silicon oxide ($SiO_x$). The first semiconductor layer is formed from undoped amorphous silicon while the second semiconductor layer is formed from amorphous silicon doped with an N-type or P-type impurity. The data metal layer is made from a metal, such as molybdenum (Mo) or copper (Cu).

Subsequently, the data metal layer is patterned by photolithography and any one of dry etching and wet etching using a second mask, thereby forming the second conductive pattern group, including the data line 104 with integral source and drain electrodes 108 and 110, the storage electrode 128 and the lower data pad electrode 162. The first semiconductor layer, the second semiconductor layer and the insulating material are patterned by a dry etching process using the second conductive pattern group as a mask to form the active layer 114, the ohmic contact layer 116 and the gate insulating pattern. The lower gate pad electrode 154 is exposed from the gate insulating pattern 180 during this etching.

Referring to FIG. 18C, a third pattern group, including the pixel electrode 122, the transparent conductive pattern 120, the upper data pad electrode 164 and the upper gate pad electrode 152, is formed on the lower substrate 101 having the second conductive pattern group and the semiconductor pattern. Further, the second conductive pattern group and the ohmic contact layer 116 located, along the third conductive pattern group, at the lower portion thereof are removed. More particularly, the integral source and drain electrodes 108 and 110 of the thin film transistor are disconnected from each other and the ohmic contact layer 116 is removed, thereby exposing the active layer 114.

To this end, the transparent conductive film is formed on the lower substrate 101 having the semiconductor pattern and the second conductive pattern group by a deposition technique, such as sputtering. The transparent conductive film is made from any one of ITO, TO, ITZO and IZO. Then, the transparent conductive film is patterned by a photolithography and an etching process using the third mask to form the third conductive pattern group, including the pixel electrode 122, the transparent conductive pattern 120, the upper data pad electrode 164 and the upper gate pad electrode 152.

The second conductive pattern group is removed by a dry or wet etching process using the third conductive pattern group as a mask while the ohmic contact layer 116 is removed by a dry etching process. More specifically, the data metal layer and the ohmic contact layer 116 provided at the channel portion of the thin film transistor are removed to disconnect the drain electrode 110 from the source electrode 108. Subsequently, a protective film 118 is formed over the entire surface of the lower substrate 101 having the third pattern group. The protective film 118 is made from an inorganic insulating material identical to the gate insulating pattern 112, or an organic insulating material, such as an acrylic organic compound having a small dielectric constant, BCB (benzocyclobutene) or PFCB (perfluorocyclobutane).

Figure 19A:
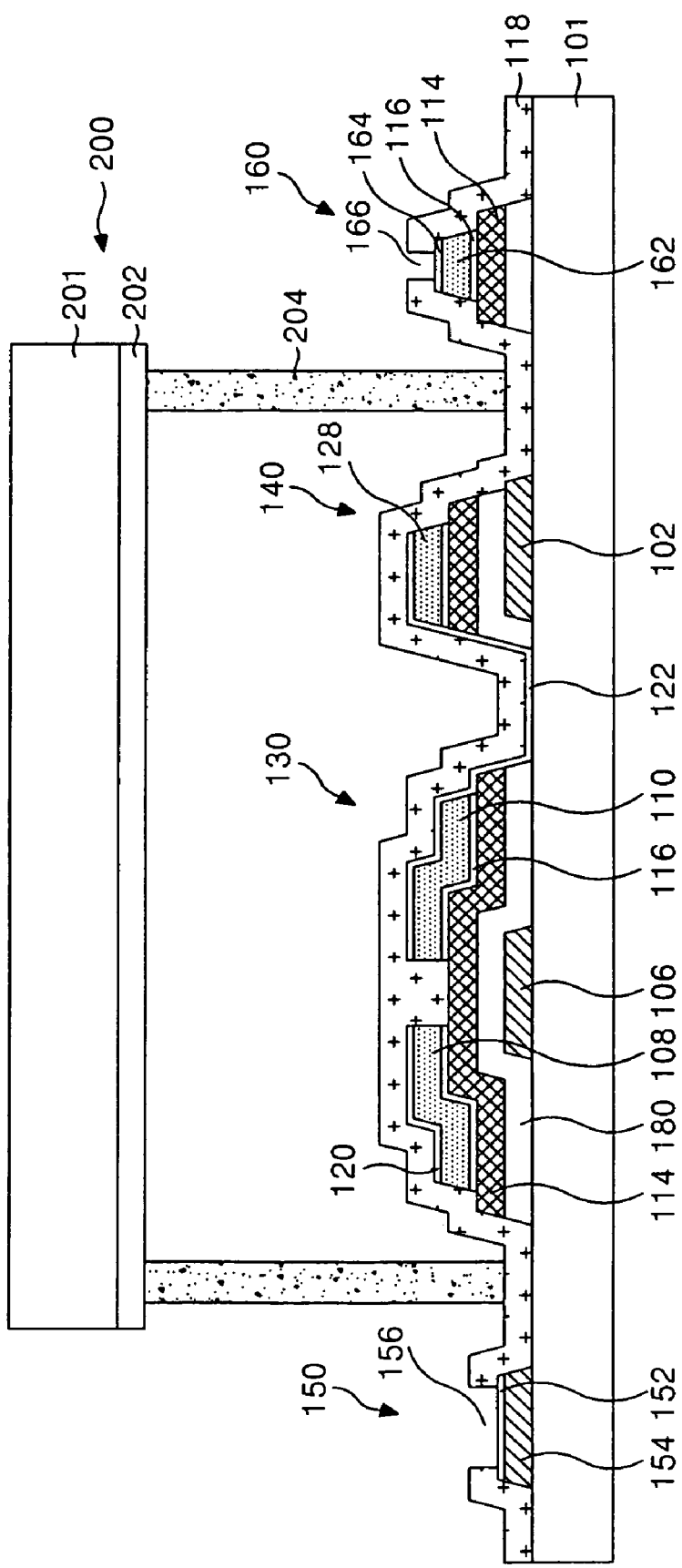
FIG. 19A and FIG. 19B are cross-sectional views showing a structure of the liquid crystal display panel including the thin film transistor array substrate shown in FIG. 17.
Figure 19B:
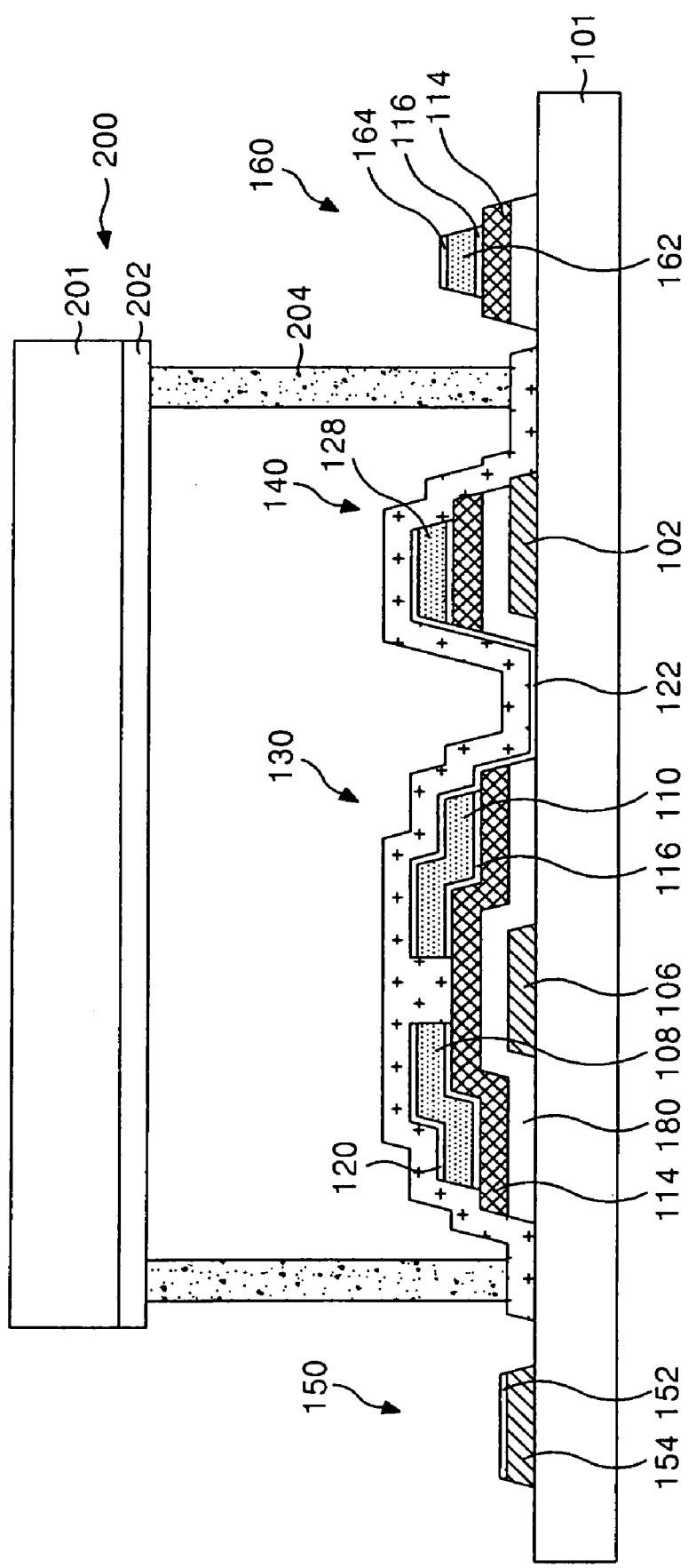

FIG. 19A and FIG. 19B are cross-sectional views showing a structure of the liquid crystal display device including the thin film transistor array substrate according to the third exemplary embodiment of the present invention. The liquid crystal display device shown in FIG. 19A and FIG. 19B is completed by joining a thin film transistor array substrate 210 according to the third exemplary embodiment of the present invention with a color filter array substrate 200 having a color filter array 202 provided on an upper substrate 201 using a sealant 204. In this case, the color filter array substrate 200 is joined in such a manner to not overlap the gate pad 150 and the data pad 160 on the thin film transistor array substrate.

Then, the protective film 118 exposed by the color filter array substrate 200 is removed by a pad opening process shown in FIG. 10A to FIG. 10E, thereby defining a second gate contact hole 158 and a data contact hole 166. The second gate contact hole 158 passes through the protective film 118 to expose the upper gate pad electrode 152 and the data contact hole 166 passes through the protective film 118 to expose the upper data pad electrode 164. In this case, the second gate contact hole 158 and the data contact hole 166 are formed by completely removing the protective film 118 at the pad area, or selectively removing the protective film 118 on the upper gate pad electrode 152 and the upper data pad electrode 164. The pad opening process for exposing the pad may use the plasma generator as shown in FIG. 10A and FIG. 10B prior to the joining process, or by dipping only the pad area into the etchant liquid as shown in FIG. 10E. In another alternative, the pad opening process may be executed by the etching process using the alignment film as a mask prior to the joining process.

As described above, according to exemplary embodiments of the present invention, the thin film transistor array substrate is formed by a three-round mask process without using a partial exposure mask. Accordingly, it becomes possible to reduce fabricating costs and to simplify the fabricating process of the thin film transistor array substrate. Because the fabrication process is simplified, production yield is improved. Further, according to exemplary embodiments of the present invention, the pad area is exposed by an etching process or pad opening process using the color filter array substrate as a mask, so that it becomes possible to simplify the fabricating method of the thin film transistor array substrate.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:
1. A method of fabricating a liquid crystal display panel comprising the step of:

forming a gate line and data line on a thin film transistor array substrate in such a manner as to cross each other;
forming a gate insulating film between the gate line and the data line on the thin film transistor array substrate;
forming a thin film transistor adjacent to the crossing of the gate line and the data line on the thin film transistor array substrate, the thin film transistor having a source, drain and gate electrodes;
forming a pixel electrode connected to the thin film transistor on the thin film transistor array substrate;
forming a protective film for protecting the thin film transistor on the thin film transistor array substrate;
forming a pad connected to one of the gate line and the data line in a pad area of the thin film transistor array substrate;
forming a transparent electrode pattern on the data line, source electrode and drain electrode of the thin film transistor array substrate;
joining a color filter array substrate to the thin film transistor array substrate so that the color filter substrate does not overlap the pad area of the thin film transistor array substrate; and
etching at least one of the gate insulating film and protective film in the pad area using the color filter array substrate as a mask;
forming a first conductive pattern group, including a gate electrode, the gate line and a gate pad electrode, on the thin film transistor array substrate;
forming a gate insulating film on the thin film transistor array substrate having the first conductive pattern group;
forming a second conductive pattern group, including the data line with the source and drain electrode integral to the data line and a lower data pad electrode, and a semiconductor pattern on the gate insulating film such that both the second conductive pattern group and the semiconductor pattern have the same pattern;
forming a third conductive pattern group, including a transparent electrode pattern and the pixel electrode, on the thin film transistor array substrate having the second conductive pattern group and the semiconductor pattern; and
forming a protective film over thin film transistor array substrate having the third conductive pattern group,
selectively exposing the gate pad electrode by exposing the gate insulating film and the protective film.

2. The method as claimed in claim 1, wherein said step of selectively exposing the gate pad electrode includes:
selectively etching the gate insulating film and the protective film at an area corresponding to the gate pad electrode.

3. The method as claimed in claim 1, further comprising:
forming a first conductive pattern group, including a gate electrode, the gate line and a gate pad electrode on the thin film transistor array substrate;
forming a gate insulating film on the thin film transistor array substrate having the first conductive pattern group;
forming a semiconductor pattern, and a second conductive pattern group, including the data line and a lower data pad electrode, on the thin film transistor array substrate having the first conductive pattern group such that the second conductive pattern and the semiconductor pattern have the same pattern;
forming a third conductive pattern group, including an upper data pad electrode, a transparent electrode pattern and the pixel electrode, on the thin film transistor array substrate having the semiconductor pattern and the second conductive pattern group; and
forming a protective film over the thin film transistor array substrate having the third conductive pattern group.

* * * * *